US012568649B2

(12) United States Patent　　　(10) Patent No.:　US 12,568,649 B2

Park　　　　　　　　　　　　　　　(45) Date of Patent:　Mar. 3, 2026

(54) THIN FILM TRANSISTOR, FABRICATING METHOD THEREOF AND DISPLAY DEVICE COMPRISING THE SAME

(71) Applicant: LG Display Co., Ltd., Seoul (KR)

(72) Inventor: JeongWoo Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 678 days.

(21) Appl. No.: 17/902,657

(22) Filed: Sep. 2, 2022

(65) Prior Publication Data

US 2023/0070356 A1　　　Mar. 9, 2023

(30) Foreign Application Priority Data

Sep. 3, 2021　(KR) ........................ 10-2021-0117950
Dec. 31, 2021　(KR) ........................ 10-2021-0194206

(51) Int. Cl.
　　*H01L 29/417*　　　(2006.01)
　　*H01L 27/32*　　　(2006.01)
　　　　　　　(Continued)

(52) U.S. Cl.
　　CPC ....... *H10D 30/6729* (2025.01); *H10D 30/031* (2025.01); *H10D 30/6755* (2025.01); *H10K 59/1213* (2023.02)

(58) Field of Classification Search
　　CPC .. H10D 30/6729; H10D 30/67; H10D 30/031; H10D 30/01; H10D 30/6755; H10D 30/6757; H10D 30/6708; H10D 30/6715; H10D 30/6723; H10D 99/00; H10D 30/6737; H10D 30/6739; H10D 86/60;

H10D 86/01; H10D 86/425; H10D 86/40; H10D 86/471; H10D 86/423; H10D 86/021; H10D 86/451; H10K 59/1213; H10K 59/121; H10K 59/50; H10K 59/131; H10K 77/111; H10K 77/10; H10K 59/352;

(Continued)

(56) References Cited

U.S. PATENT DOCUMENTS 9,905,695　B2 *　2/2018　Hanaoka ............ H10D 30/6713
10,593,809　B2 *　3/2020　Suzuki ............... H10D 30/6755

(Continued)

FOREIGN PATENT DOCUMENTS

JP　　　2014-225652 A　　12/2014
JP　　　2015-38895 A　　2/2015

(Continued)

*Primary Examiner* — Nikolay K Yushin

(74) *Attorney, Agent, or Firm* — Birch, Stewart, Kolasch & Birch, LLP

(57) ABSTRACT

A thin film transistor, a fabricating method of the thin film transistor and a display device comprising the thin film transistor are provided. The thin film transistor can include a source electrode and a drain electrode disposed on a substrate and spaced apart from each other with a gap area formed therebetween, a first active layer disposed in the gap area between the source electrode and the drain electrode, and a gate insulating layer covering the source electrode, the first active layer and the drain electrode. The thin film transistor can further include a gate electrode disposed on the gate insulating layer and overlapping the first active layer. The first active layer can be in contact with a side of the source electrode and a side of the drain electrode.

20 Claims, 15 Drawing Sheets

(51) Int. Cl.
*H10D 30/01* (2025.01)
*H10D 30/67* (2025.01)
*H10K 59/121* (2023.01)

(58) Field of Classification Search
CPC .. H10K 59/1201; H10K 59/353; H10K 59/12;
H10K 2102/311
See application file for complete search history.

(56) References Cited

U.S. PATENT DOCUMENTS

| | | | | |
|---|---|---|---|---|
| 12,245,487 B2 * | 3/2025 | Kim | ........................ | H10K 59/38 |
| 2016/0247934 A1 * | 8/2016 | Hanaoka | ............ | H10D 30/6729 |
| 2019/0148558 A1 * | 5/2019 | Suzuki | ............... | H10D 30/6755 |
| | | | | 257/43 |
| 2022/0399404 A1 * | 12/2022 | Kim | .................... | H10K 59/126 |

FOREIGN PATENT DOCUMENTS

| | | | |
|---|---|---|---|
| JP | 2015-144271 A | 8/2015 |
| JP | 2016-197708 A | 11/2016 |
| JP | 2018-98504 A | 6/2018 |
| JP | 2019-91794 A | 6/2019 |
| JP | 2021-55049 A | 4/2021 |
| JP | 2021-68866 A | 4/2021 |
| KR | 10-2010-0073534 A | 7/2010 |
| WO | WO 2018/051860 A1 | 3/2018 |
| WO | WO 2019/186331 A1 | 10/2019 |
| WO | WO 2020/003047 A1 | 1/2020 |

* cited by examiner

THIN FILM TRANSISTOR, FABRICATING METHOD THEREOF AND DISPLAY DEVICE COMPRISING THE SAME

CROSS-REFERENCE TO RELATED APPLICATIONS

This application claims the benefit of priority to the Korean Patent Application No. 10-2021-0117950 filed on Sep. 3, 2021 and Korean Patent Application No. 10-2021-0194206 filed on Dec. 31, 2021, the entire contents of all these applications are hereby expressly incorporated by reference into the present application.

BACKGROUND OF THE DISCLOSURE

Field of the Invention

The embodiments of the present disclosure relate to a thin film transistor, a fabricating method thereof and a display device comprising the thin film transistor.

Discussion of the Related Art

Since a thin film transistor can be fabricated on a glass substrate or a plastic substrate, the thin film transistor has been widely used as a switching element or a driving element of a display device such as a liquid crystal display device or an organic light emitting display device.

The thin film transistor can be categorized into: (a) an amorphous silicon thin film transistor in which amorphous silicon is used as an active layer, (b) a polycrystalline silicon thin film transistor in which polycrystalline silicon is used as an active layer, and (c) an oxide semiconductor thin film transistor in which oxide semiconductor is used as an active layer, all based on a material constituting the active layer.

An oxide semiconductor thin film transistor (TFT), which has a large resistance change in accordance with an oxygen content, has an advantage in that desired properties can be easily obtained. Further, since an oxide constituting an active layer can be grown at a relatively low temperature during a process of fabricating the oxide semiconductor thin film transistor, the fabricating cost of the oxide semiconductor thin film transistor can be reduced. Also, in view of the properties of oxide, since an oxide semiconductor is transparent, it is favorable to be used to form a transparent display device.

The oxide semiconductor thin film transistor may need to be conductorized for electrical contact between an oxide semiconductor and other components. However, a process error may occur in the process of conductorizing the oxide semiconductor.

Also, in the oxide semiconductor thin film transistor, it is preferable that an ON-current of the thin film transistor can be improved and a leakage current may not occur in an OFF-state of the thin film transistor, which can improve the driving characteristics of the oxide semiconductor thin film transistor.

In consideration of these issues, studies for further improving the driving characteristics of the oxide semiconductor thin film transistor are desired and ongoing.

SUMMARY OF THE DISCLOSURE

The present disclosure has been made in view of the above issues and limitations associated with the related art, and it is an object of the present disclosure to provide a thin film transistor that has excellent on-current characteristics and is capable of preventing a leakage current in an OFF-state.

It is another object of the present disclosure to provide a thin film transistor in which an active layer is disposed between a source electrode and a drain electrode to avoid occurrence of an alignment error and reduce the number of contact holes for connecting the active layer with other components.

It is still another object of the present disclosure to provide a thin film transistor capable of effectively protecting a main active layer serving as a main channel.

It is further still another object of the present disclosure to provide a thin film transistor that includes an active layer disposed below a source electrode and a drain electrode to effectively prevent a leakage current from occurring.

It is further still another object of the present disclosure to provide a fabricating method of a thin film transistor that includes an active layer disposed below a source electrode and a drain electrode.

It is further still another object of the present disclosure to provide a display device comprising the above thin film transistor.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor comprising source and drain electrodes spaced apart from each other, a first active layer between the source electrode and the drain electrode, and a gate electrode overlapped with the first active layer, wherein the first active layer is in contact with a side of the source electrode and a side of the drain electrode.

The first active layer may not be in contact with an upper surface and a lower surface of the source electrode, and may not be in contact with an upper surface and a lower surface of the drain electrode.

The first active layer can have a thickness equal to or smaller than that of the source electrode. The entire first active layer can overlap the gate electrode.

The source electrode and the drain electrode can have an etch rate smaller than that of the first active layer. Each of the source electrode and the drain electrode can include titanium (Ti).

The first active layer can include a first oxide semiconductor layer and a second oxide semiconductor layer. The first oxide semiconductor layer can have mobility higher than that of the second oxide semiconductor layer. The first oxide semiconductor layer can cover sides and a lower surface of the second oxide semiconductor layer.

The second oxide semiconductor layer may not be in contact with the source electrode and the drain electrode. The second oxide semiconductor layer can cover sides and a lower surface of the first oxide semiconductor layer.

The first oxide semiconductor layer may not be in contact with the source electrode and the drain electrode.

According to another embodiment of the present disclosure, the thin film transistor can further comprise a second active layer overlapped with the source electrode, the drain electrode and the first active layer, wherein the first active layer can be disposed between the gate electrode and the second active layer.

The second active layer can be in contact with a lower surface of the source electrode and a lower surface of the drain electrode. The second active layer can have mobility lower than that of the first active layer.

The first active layer can include a first oxide semiconductor layer and a second oxide semiconductor layer, and the first oxide semiconductor layer can be in contact with the second active layer.

The first oxide semiconductor layer can have mobility higher than that of the second oxide semiconductor layer. The first oxide semiconductor layer can have mobility higher than that of the second active layer. The first oxide semiconductor layer can cover sides and a lower surface of the second oxide semiconductor layer.

The second oxide semiconductor layer may not be in contact with the source electrode, the drain electrode and the second active layer.

In accordance with another aspect of the present disclosure, the above and other objects can be accomplished by the provision of a display device comprising the above thin film transistor.

In accordance with other aspect of the present disclosure, the above and other objects can be accomplished by the provision of a fabricating method of a thin film transistor, comprising forming a second active material layer on a substrate, forming a source electrode and a drain electrode on the second active material layer, forming a first active material layer on the second active material layer, the source electrode and the drain electrode, and patterning the first active material layer and the second active material layer to form a first active layer and a second active layer, wherein the first active layer is disposed between the source electrode and the drain electrode, and is in contact with the second active layer.

The first active material layer and the second active material layer can be patterned together. The forming a first active material layer can include forming a first oxide semiconductor material layer and forming a second oxide semiconductor material layer.

BRIEF DESCRIPTION OF THE DRAWINGS

The above and other objects, features and other advantages of the present disclosure will be more clearly understood from the following detailed description taken in conjunction with the accompanying drawings, in which.

4

Figure 8:
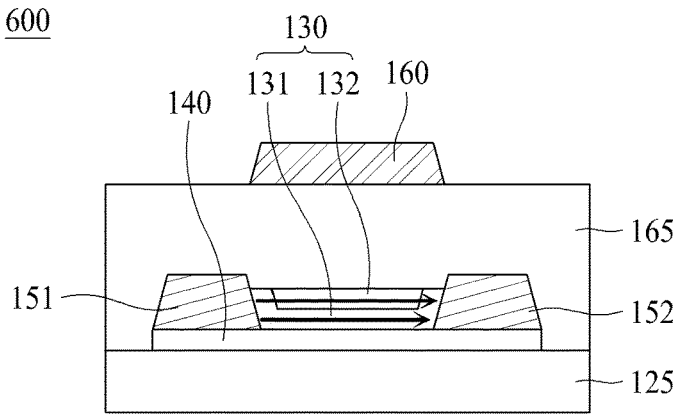
Figure 9A:
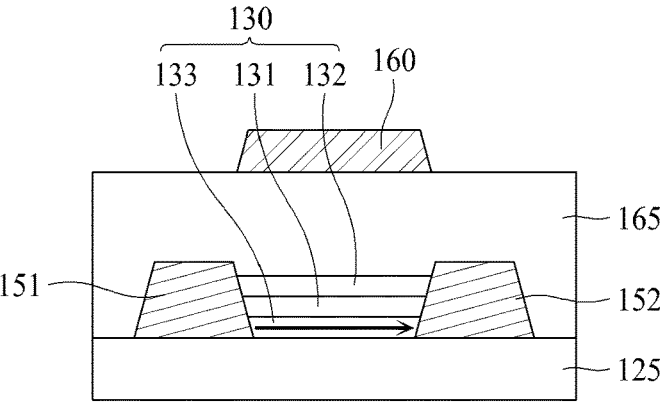
Figure 9B:
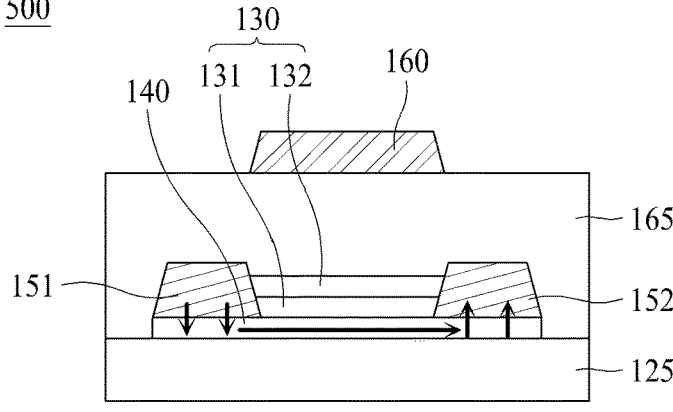
Figure 11:
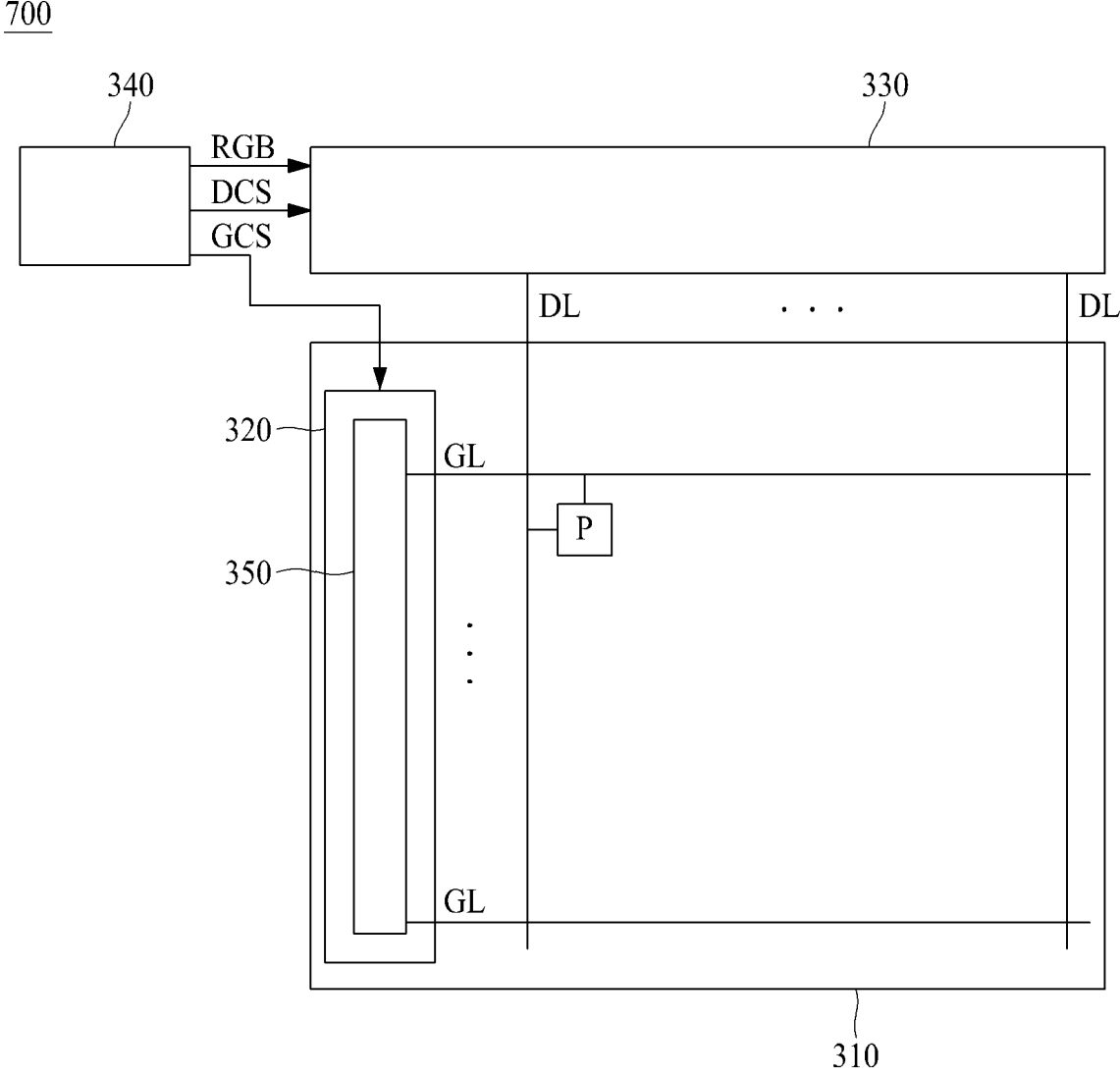
Figure 12:
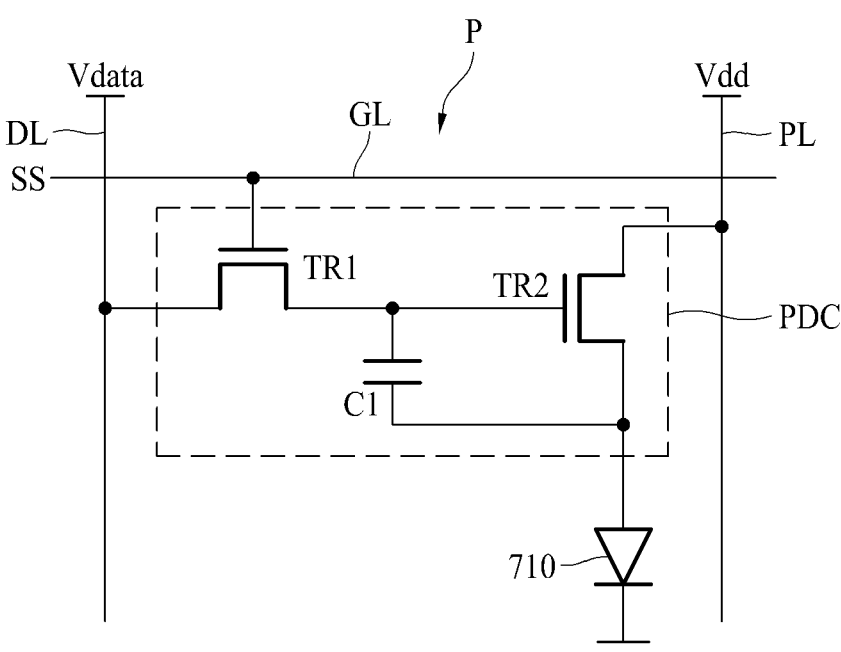
Figure 13:
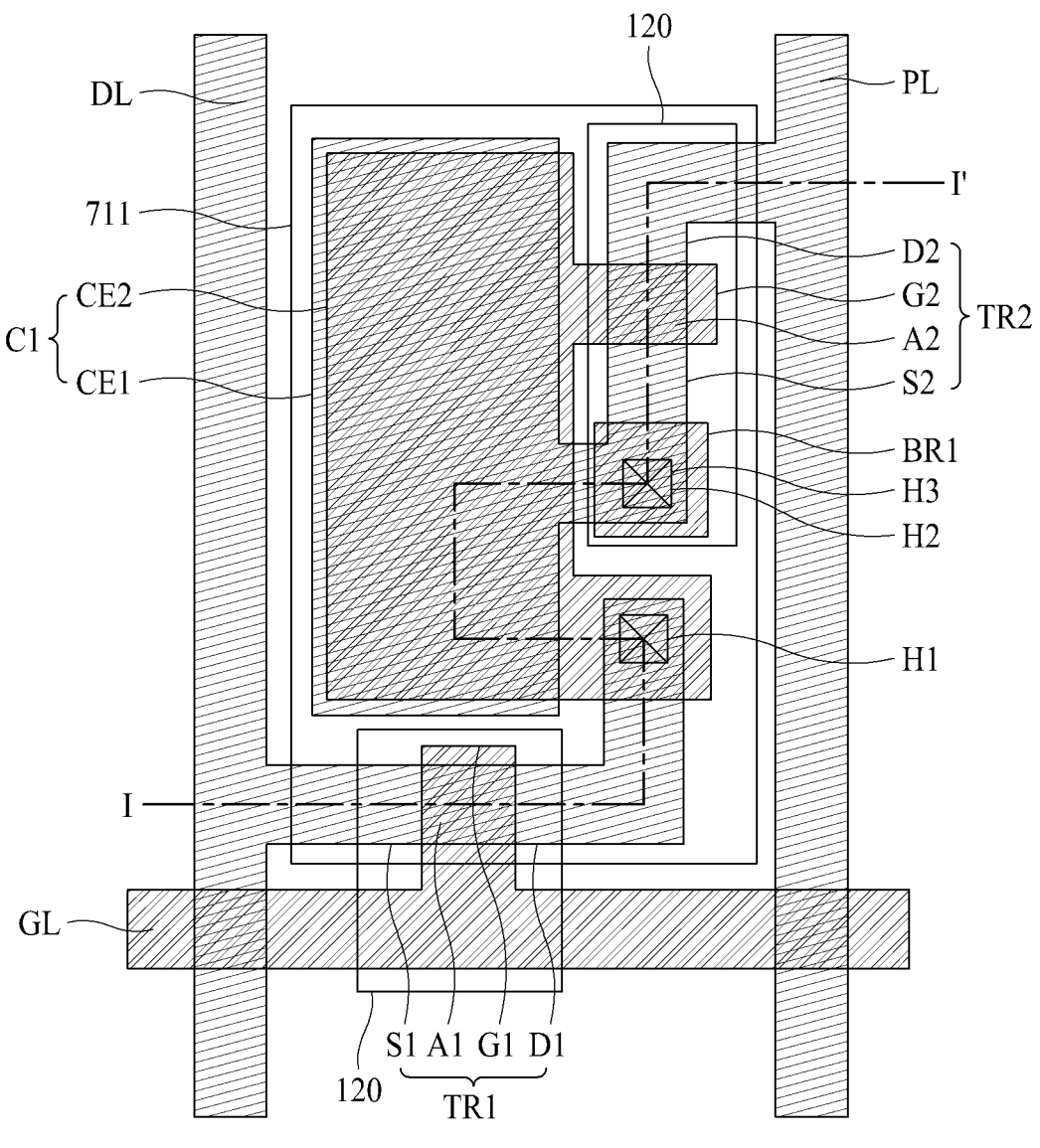
Figure 14:
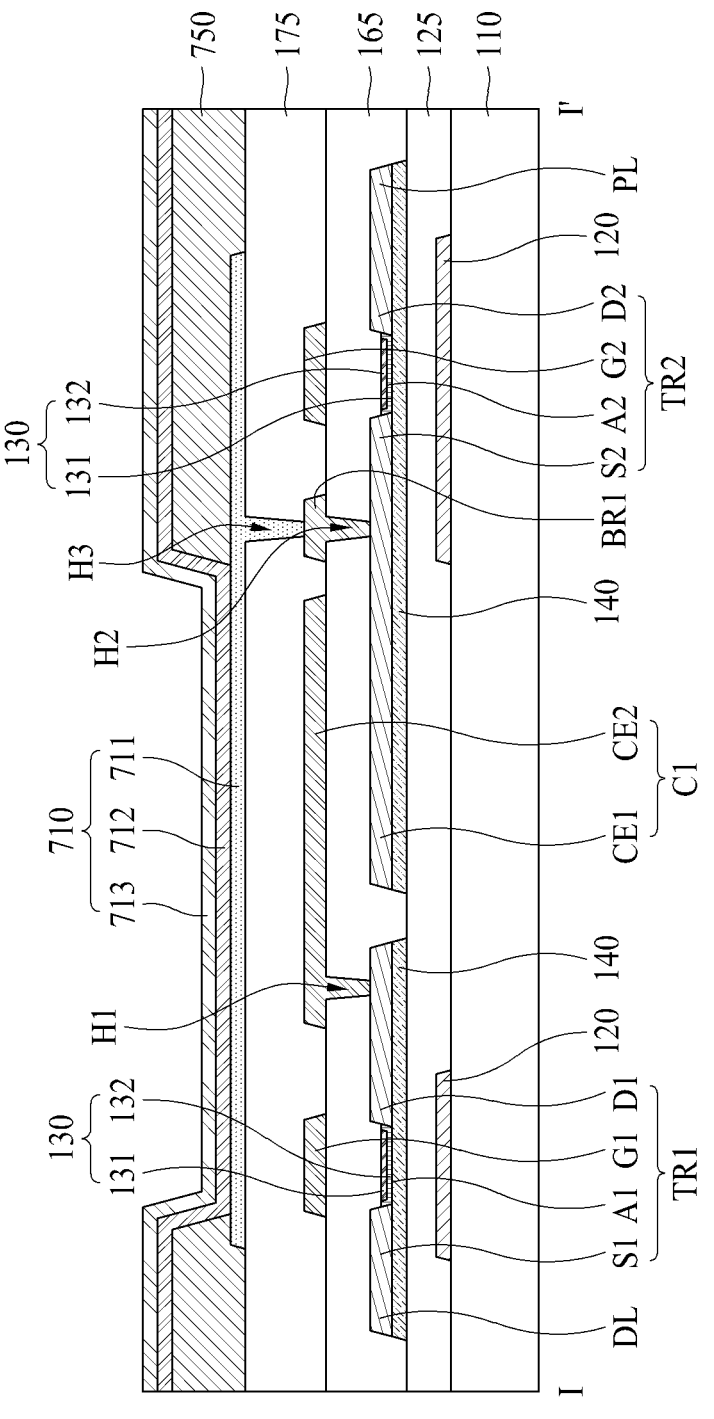
Figure 15:
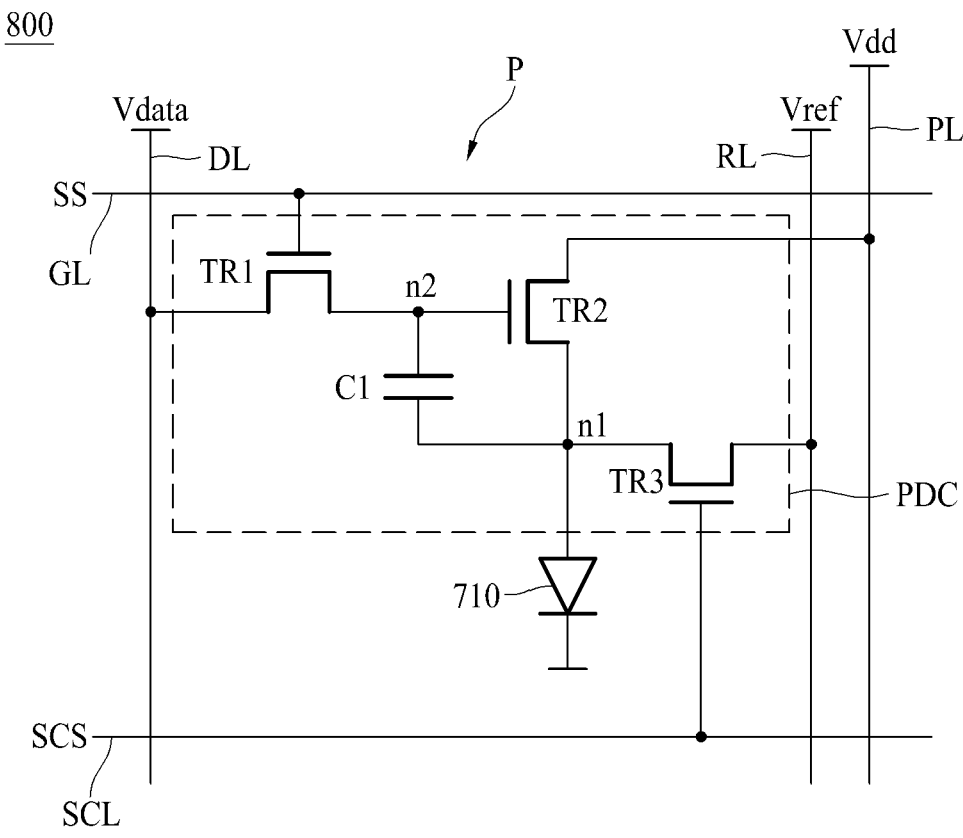
Figure 16:
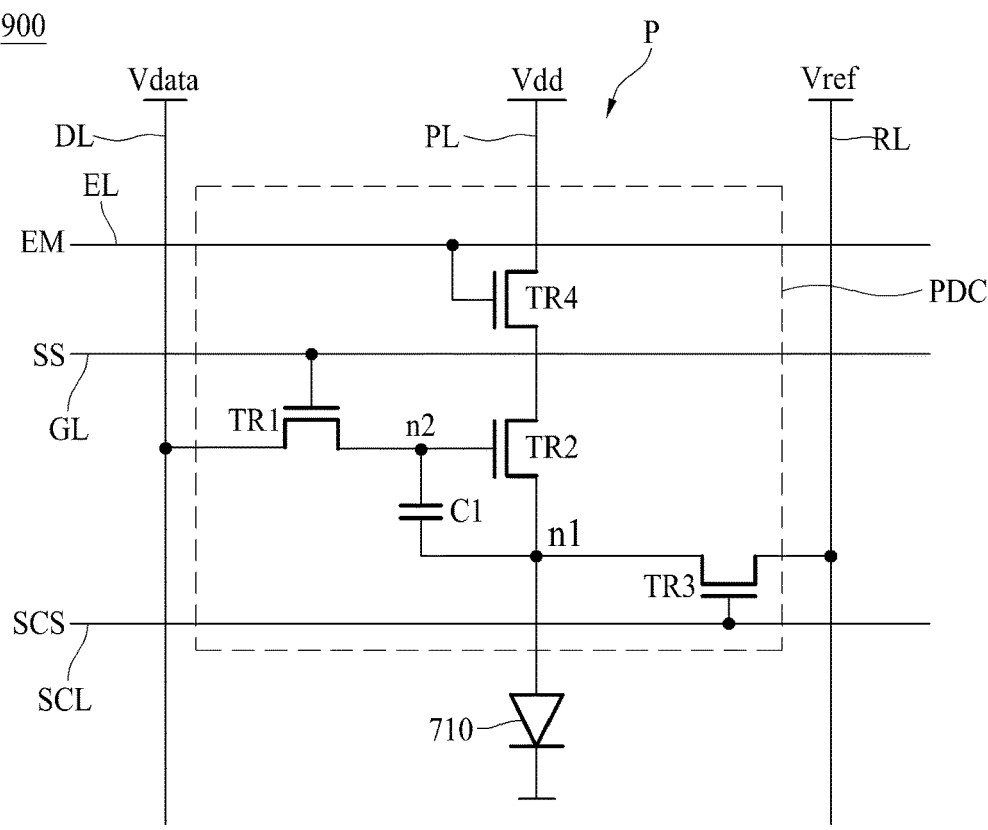
Figure 17:
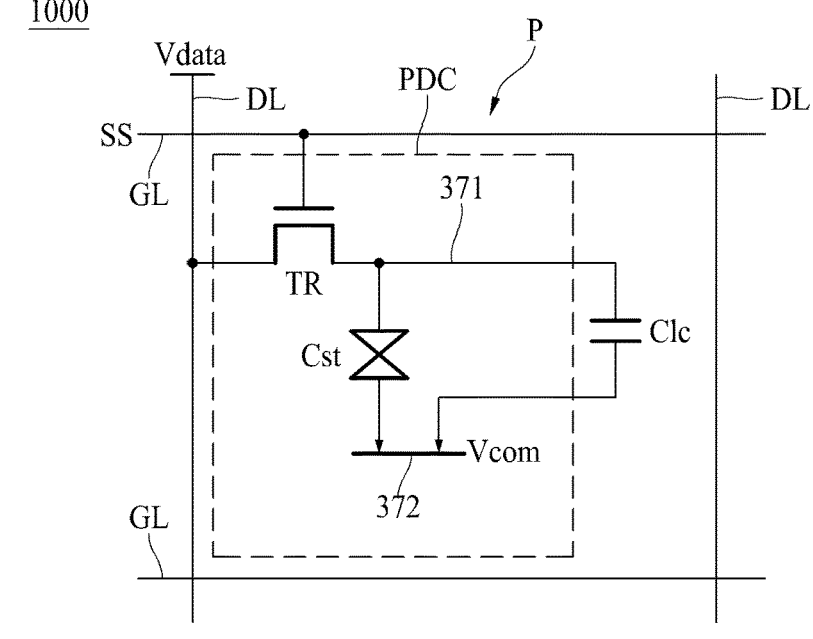

FIG. 8 is a schematic view illustrating an ON-current path of a thin film transistor according to an embodiment of the present disclosure;

FIGS. 9A and 9B are schematic views illustrating a leakage current path of a thin film transistor;

FIGS. 10A to 10G are views illustrating a fabricating process of a thin film transistor according to an embodiment of the present disclosure;

FIG. 11 is a schematic view illustrating a display device according to an embodiment of the present disclosure;

FIG. 12 is a circuit diagram illustrating an example of a pixel of FIG. 11;

FIG. 13 is a plan view illustrating an example of a pixel of FIG. 12;

FIG. 14 is a cross-sectional view taken along line I-I' of FIG. 13;

FIG. 15 is a circuit diagram illustrating another example of a pixel of a display device according to an embodiment of the present disclosure;

FIG. 16 is a circuit diagram illustrating another example of a pixel of a display device according to an embodiment of the present disclosure; and FIG. 17 is a circuit diagram illustrating another example of a pixel of a display device according to an embodiment of the present disclosure.

DETAILED DESCRIPTION OF THE EMBODIMENTS

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description may be omitted or may be provided briefly.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-', and 'next to-', one or more portions can be arranged between two other portions unless 'just' or 'direct' is used.

Spatially relative terms such as "below", "beneath", "lower", "above", and "upper" can be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device can be arranged "above" another device. Therefore, an exemplary term "below or beneath" can include "below or beneath" and "above" orientations. Likewise, an exemplary term "above" or "on" can include "above" and "below or beneath" orientations.

In describing a temporal relationship, for example, when the temporal order is described as "after," "subsequent," "next," and "before," a case which is not continuous can be included, unless "just" or "direct" is used.

It will be understood that, although the terms "first", "second", etc. can be used herein to describe various elements, these elements should not be limited by these terms. These terms are only used to partition one element from another, and may not define order. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode can be used interchangeably. The source electrode can be the drain electrode, and the drain electrode can be the source electrode. Also, the source electrode in any one embodiment of the present disclosure can be the drain electrode in another embodiment of the present disclosure, and the drain electrode in any one embodiment of the present disclosure can be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region can be a source electrode, and a drain region can be a drain electrode. Also, a source region can be a drain electrode, and a drain region can be a source electrode.

Further, all components of each thin film transistor according to all embodiments of the present disclosure are operatively coupled and configured. In addition, all components of each display device according to all embodiments of the present disclosure are operatively coupled and configured.

Figure 1:
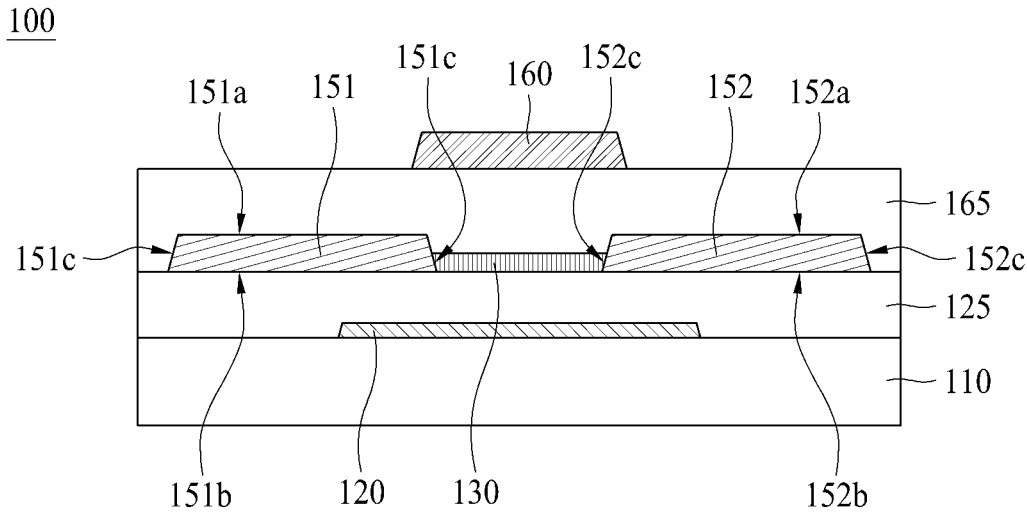
FIG. 1 is a cross-sectional view illustrating one example of a thin film transistor according to an embodiment of the present disclosure.

FIG. 1 is a cross-sectional view illustrating a thin film transistor 100 according to an embodiment of the present disclosure.

Referring to FIG. 1, the thin film transistor 100 according to the embodiment of the present disclosure includes source and drain electrodes 151 and 152 spaced apart (i.e., completely separated with a gap therebetween) from each other, a first active layer 130 between the source electrode 151 and the drain electrode 152, and a gate electrode 160 that overlaps the first active layer 130. The first active layer 130 is disposed in the gap between the source and drain electrodes 151 and 152, but may not be disposed under or over the source or drain electrode 151, 152.

The source electrode 151, the drain electrode 152 and the first active layer 130 of the thin film transistor 100 can be disposed on a substrate 110.

The substrate 110 can include at least one of glass or polymer resin. For example, a glass substrate or a polymer resin substrate can be used as the substrate 110. As an example, a plastic substrate can be used as the polymer resin substrate. The plastic substrate can include at least one of polyimide (PI), polycarbonate (PC), polyethylene (PE), polyester, polyethylene terephthalate (PET) or polystyrene (PS), which is a transparent polymer resin having flexible properties.

Referring to FIG. 1, a light shielding layer 120 can be disposed on the substrate 110. The light shielding layer 120 has a light shielding characteristic. The light shielding layer 120 can shield light incident from the substrate 110 to protect the first active layer 130.

The light shielding layer 120 can include metal. The light shielding layer can be made of a single layer or can have a multi-layered structure. In an example, the light shielding layer 120 can have electrical conductivity, and can be connected to the source electrode 151 and/or also connected to the drain electrode 152. In an example, the light shielding layer 120 can be also connected to the gate electrode 115. When the light shielding layer 120 is connected to the gate electrode 160, a double gate structure can be provided.

A buffer layer 125 can be disposed on the light shielding layer 120. The buffer layer 125 covers an upper surface of the light shielding layer 120. The buffer layer 125 has insulation properties and protects the first active layer 130. The buffer layer 125 can be referred to as a protective layer or an insulating layer.

The buffer layer 125 can include at least one of silicon oxide (SiOx), silicon nitride (SiNx), hafnium oxide (HfOx), aluminum oxide (AlOx), zirconium oxide (ZrOx), hafnium silicate (Hf-SiOx) or zirconium silicate (Zr-SiOx), which has insulation properties.

Referring to FIG. 1, the source electrode 151 and the drain electrode 152 can be disposed on the buffer layer 125. The source electrode 151 and the drain electrode 152 are disposed to be spaced apart from each other.

Each of the source electrode 151 and the drain electrode 152 can include at least one of molybdenum (Mo), aluminum (Al), chromium (Cr), gold (Au), titanium (Ti), nickel (Ni), neodymium (Nd), copper (Cu) or their alloy. Each of the source electrode 151 and the drain electrode 152 can be made of a single layer made of a metal or a metal alloy, or can be made of two or more layers.

According to one embodiment of the present disclosure, the source electrode 151 and the drain electrode 152 can have an etch rate smaller than that of the first active layer 130. In more detail, the source electrode 151 and the drain electrode 152 can have an etch rate smaller than that of the first active layer 130 with respect to an etching solution for etching the first active layer 130.

For example, the source electrode 151 and the drain electrode 152 can include at least one of a metal having an etch rate smaller than that of the first active layer 130.

According to one embodiment of the present disclosure, each of the source electrode 151 and the drain electrode 152 can include titanium (Ti). The titanium (Ti) can have excellent resistance to the etching solution for etching the first active layer 130. Therefore, when each of the source electrode 151 and the drain electrode 152 includes titanium (Ti), the source electrode 151 and the drain electrode 152 can maintain their shape without being damaged during the etching process of the first active layer 130.

For example, the source electrode 151 and the drain electrode 152 can have a single layered structure made of titanium (Ti). Further, the source electrode 151 and the drain electrode 152 can have a multi-layered structure made of titanium (Ti).

When the source electrode 151 and the drain electrode 152 have a multi-layered structure made of titanium (Ti), the layer made of titanium (Ti) can be disposed on the uppermost layer of the source electrode 151 and the drain electrode 152. The layer made of titanium (Ti) can be disposed on the uppermost layer of the source electrode 151 and the drain electrode 152 to protect the source electrode 151 and the drain electrode 152 during the etching process of the first active layer 130.

Each of the source electrode 151 and the drain electrode 152 can include other metals in addition to titanium (Ti), which are resistant to the etching solution for the first active layer 130.

The first active layer 130 can be disposed on the buffer layer 125. The first active layer 130 can overlap the light shielding layer 120.

The first active layer 130 can include an oxide semiconductor material. According to one embodiment of the present disclosure, the first active layer 130 can be an oxide semiconductor layer made of an oxide semiconductor material, for example.

Referring to FIG. 1, the first active layer 130 is disposed between the source electrode 151 and the drain electrode 152. In detail, the first active layer 130 can be disposed in a space defined by the source electrode 151, the drain electrode 152 and the buffer layer 125. For example, the first active layer 130 can be disposed in a gap area between the source and drain electrodes 151 and 152 above the buffer layer 125.

According to one embodiment of the present disclosure, the first active layer 130 can be in contact with a side 151c of the source electrode 151 and a side 152c of the drain electrode 152. The source electrode 151 can have multiple sides 151c, and the drain electrode 152 can have multiple sides 152c.

As shown, the first active layer 130 is in contact with the inner side 151c of the source electrode 151 and the inner side 152c of the drain electrode 152, thereby making sure of the shortest charge transfer path between the source electrode 151 and the drain electrode 152. As a result, when a gate voltage is applied to the gate electrode 160 to turn on the thin film transistor 100, current can flow at the shortest distance. In this way, as the current flows between the source electrode 151 and the drain electrode 152 without loss on the path, the on-current characteristics of the thin film transistor 100 can be improved.

The first active layer 130 may not be in contact with an upper surface 151a and a lower surface 151b of the source electrode 151, and may not be in contact with an upper surface 152a and a lower surface 152b of the drain electrode 152, either. For instance, the first active layer 130 may be in contact with only the inner sides 151c and 152c.

According to one embodiment of the present disclosure, a surface toward the substrate 110 in each layer will be referred to as a lower surface, and an opposite surface of the lower surface of the substrate 110 will be referred to as an upper surface. Also, surfaces between the upper surface and the lower surface will be referred to as sides.

When the gate voltage is applied to the gate electrode 160, current can flow through a path near the gate electrode 160 of the first active layer 130. According to one embodiment of the present disclosure, the gate electrode 160 is disposed above the first active layer 130. Therefore, when the gate voltage is applied to the gate electrode 160, the current can mainly flow through an upper area of the first active layer 130.

In this embodiment, the first active layer 130 of the TFT 100 is disposed only between the inner sides of the source and drain electrodes 151 and 152, and is not disposed on other surfaces such as the upper and lower surfaces or outer sides of the source and drain electrodes 151 and 151.

Figure 7A:
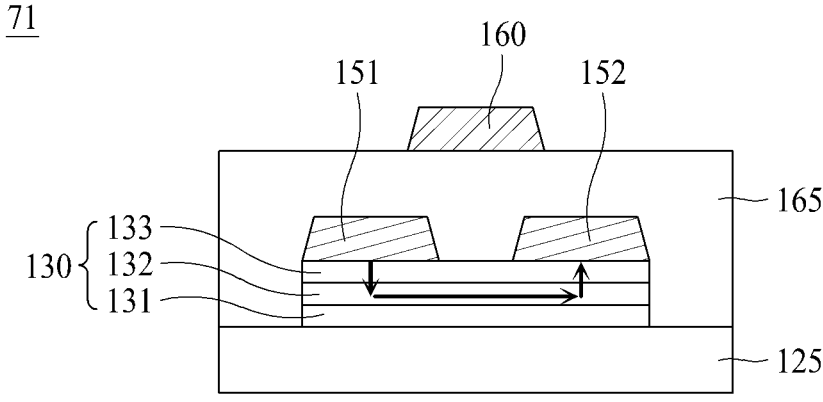
FIGS. 7A and 7B are schematic views illustrating an ON-current path of a thin film transistor according to a comparative example.
Figure 7B:
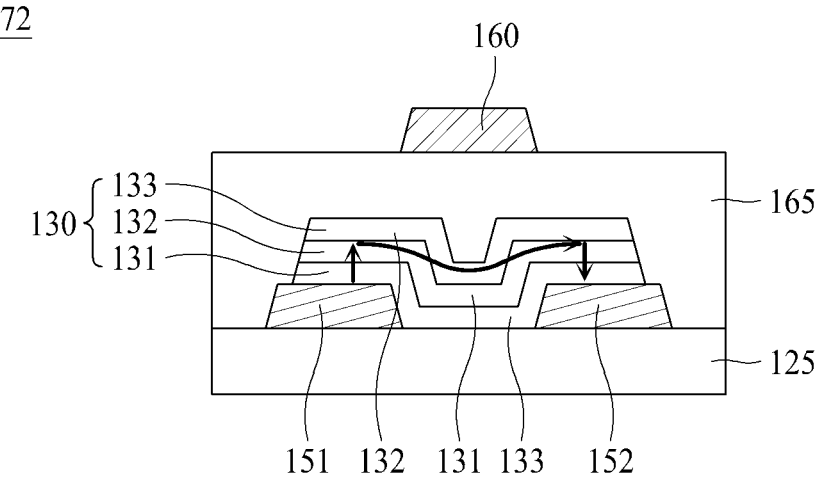

On the other hand, if for some reason the first active layer 130 were to be disposed on the upper surface 151a of the source electrode 151 and the upper surface 152a of the drain electrode 152, a current path flowing through the first active layer 130 disposed on the upper surface 151a of the source electrode 151 and the upper surface 152a of the drain electrode 152 can occur (see FIG. 7B). When the current path flowing through the first active layer 130 disposed on the upper surface 151a of the source electrode 151 and the upper surface 152a of the drain electrode 152 occurs, the current path can be lengthened and resistance on the current path can be increased, whereby on-current characteristics of the thin film transistor 100 can be deteriorated.

According to one embodiment of the present disclosure, since the first active layer 130 is disposed only in the space between the source electrode 151 and the drain electrode 152 without being in contact with the upper surface 151a and the lower surface 151b of the source electrode 151, the current can flow between the source electrode 151 and the drain electrode 152 through the shortest path without loss on the path. As a result, the on-current characteristics of the thin film transistor 100 can be improved.

The first active layer 130 can have a thickness equal to or smaller than that of the source electrode 151 and/or the drain electrode 152. When the first active layer 130 has a thickness equal to or smaller than that of the source electrode 151 and/or the drain electrode 152, the first active layer 130 can be stably disposed in the space between the source electrode 151 and the drain electrode 152.

According to one embodiment of the present disclosure, the source electrode 151 and the drain electrode 152 can have substantially the same thickness. Therefore, the first active layer 130 can have a thickness equal to or smaller than that of the drain electrode 152.

To improve current characteristics, the first active layer 130 can have high mobility characteristics. For example, the first active layer 130 can be made of a high mobility oxide semiconductor material.

According to one embodiment of the present disclosure, the first active layer 130 can include at least one of an IGZO(InGaZnO)-based oxide semiconductor material, an IZO(InZnO)-based oxide semiconductor material, an IGZTO(InGaZnSnO)-based oxide semiconductor material, an ITZO(InSnZnO)-based oxide semiconductor material, a ZnO-based oxide semiconductor material, a SIZO(SiIn-ZnO)-based oxide semiconductor material or a ZnON(Zn- Oxynitride)-based oxide semiconductor material, which is known as having high mobility characteristics.

Gallium (Ga) can deteriorate mobility of the oxide semiconductor. Therefore, when an indium (In)-based oxide semiconductor constituting the first active layer 130 includes gallium (Ga), a concentration of indium (In) can be set to be greater than that of gallium (Ga) [In concentration>Ga concentration].

A gate insulating layer 165 is disposed on the first active layer 130. Further, the gate insulating layer 165 can be disposed to cover the source electrode 151, the first active layer and the drain electrode 152 on the buffer layer 125. The gate insulating layer 165 can include at least one of silicon oxide (SiOx), silicon nitride (SiNx), hafnium oxide (HfOx), aluminum oxide (AlOx), zirconium oxide (ZrOx), hafnium silicate (Hf-SiOx) or zirconium silicate (Zr-SiOx). The gate insulating layer 165 can have a single layered structure, or can have a multi-layered structure.

A gate electrode 160 is disposed on the gate insulating layer 165. The gate electrode 160 is spaced apart from the first active layer 130, and at least partially overlaps the first active layer 130.

The gate electrode 160 can include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). The gate electrode 160 can have a multi-layered structure that includes at least two conductive layers having their respective physical properties different from each other.

According to one embodiment of the present disclosure, the entire first active layer 130 can serve as a channel portion in the space between the source electrode 151 and the drain electrode 152. In order to allow the first active layer 130 to stably serve as the channel portion, the gate electrode 160 can fully cover the first active layer 130.

For example, the entire first active layer 130 can overlap with the gate electrode 160 or a portion thereof. As a result, the entire first active layer 130 can serve as the channel portion. The gate electrode 160 can cover the first active layer 130 on a plane. In one example, the gate electrode 160 can have the same area as that of the first active layer 130, and can cover the entire first active layer 130. In consideration of a process error in the fabricating process, the gate electrode 160 can be designed to have an area greater than that of the first active layer 130. For instance, the size and shape of the entire first active layer 130 can correspond to and/or can be equal to or less than the size and shape of the entire gate electrode 160 so that the gate electrode 160 or a portion thereof covers the entire first active layer 130.

Figure 2A:
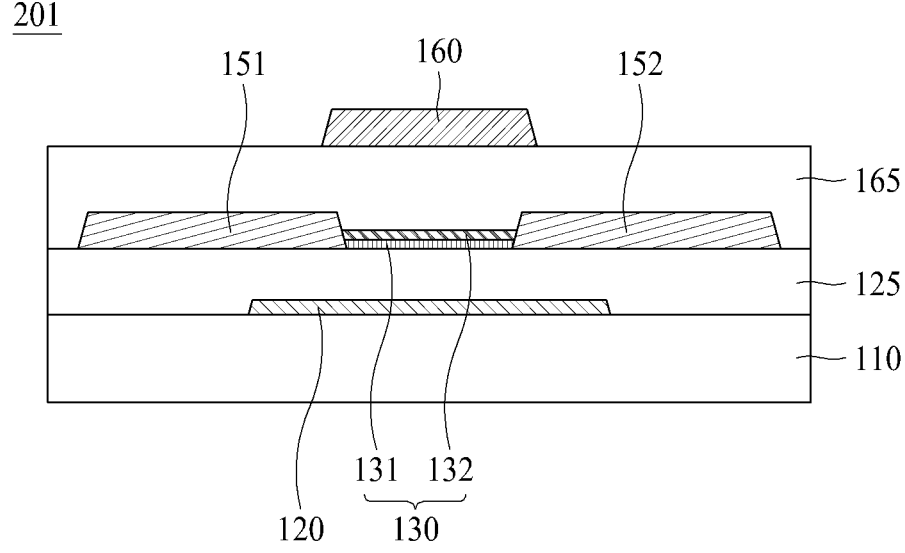
FIGS. 2A and 2B are cross-sectional views illustrating other examples of thin film transistors according to an embodiment of the present disclosure.
Figure 2B:
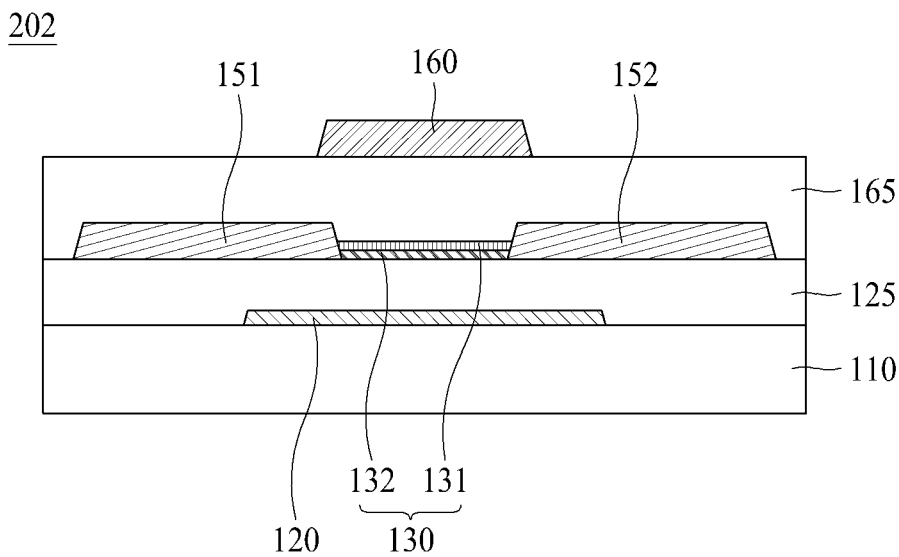

FIGS. 2A and 2B are respectively cross-sectional views of other examples of a thin film transistor (thin film transistors 201 and 202) according to an embodiment of the present disclosure. Hereinafter, the description of the already described elements may be omitted or may be provided briefly in order to avoid redundancy.

In the thin film transistor 201, referring to FIG. 2A, the first active layer 130 can include a first oxide semiconductor layer 131 and a second oxide semiconductor layer 132. The second oxide semiconductor layer 132 can be disposed on the first oxide semiconductor layer 131.

The first oxide semiconductor layer 131 can have mobility higher than that of the second oxide semiconductor layer 132. The first oxide semiconductor layer 131 can serve as a main channel layer.

The first oxide semiconductor layer 131 can be made of, for example, a high mobility oxide semiconductor material. The first oxide semiconductor layer 131 can include at least one of an IGZO(InGaZnO)-based oxide semiconductor material [In concentration>Ga concentration], an IZO(InZnO)-based oxide semiconductor material, an IGZTO(InGaZnSnO)-based oxide semiconductor material, an ITZO (InSnZnO)-based oxide semiconductor material, an ITZO (InSnZnO)-based oxide semiconductor material, a FIZO (FeInZnO)-based oxide semiconductor material, a ZnO-based oxide semiconductor material, a SIZO(SiInZnO)-based oxide semiconductor material or a ZnON(Zn-Oxynitride)-based oxide semiconductor material, which are known as having high mobility characteristics.

According to another embodiment of the present disclosure, the second oxide semiconductor layer 132 can be made of an oxide semiconductor material having excellent reliability. For example, the second oxide semiconductor layer 132 can include a gallium (Ga)-based oxide semiconductor material. In detail, the second oxide semiconductor layer 132 can include at least one of an IGZO(InGaZnO)-based oxide semiconductor material [Ga concentration>In concentration], a GZO(GaZnO)-based oxide semiconductor material, an IGO(InGaO)-based oxide semiconductor material or a GZTO(GaZnSnO)-based oxide semiconductor material.

Indium (In) increases mobility of the oxide semiconductor, and gallium (Ga) has characteristics that improve film stability. Therefore, when the second oxide semiconductor layer 132 includes indium (In) and gallium (Ga), the concentration of gallium (Ga) can be set to be greater than that of indium (In) [Ga concentration>In concentration]. As a result, stability of the second oxide semiconductor layer 132 can be improved.

The second oxide semiconductor layer 132 can be disposed on the first oxide semiconductor layer 131 to protect the first oxide semiconductor layer 131.

The second oxide semiconductor layer 132 can protect the upper surface of the first oxide semiconductor layer 131 exposed from the buffer layer 125, the source electrode 151 and the drain electrode 152, whereby stability of the first active layer 130 can be improved. As a result, driving stability and reliability of the thin film transistor 100 can be improved.

In another example referring to FIG. 2B, in the TFT 202, the first active layer 130 can include a first oxide semiconductor layer 131 and a second oxide semiconductor layer 132, and the first oxide semiconductor layer 131 can be disposed on the second oxide semiconductor layer 132. The first oxide semiconductor layer 131 serving as a main channel layer due to high mobility characteristics can be disposed to be close to the gate electrode 160. The second oxide semiconductor layer 132 can be disposed below the first oxide semiconductor layer 131 to support and protect the first oxide semiconductor layer 131.

A structure in which the first active layer 130 is formed of two layers will be referred to as a bi-layer structure. FIGS. 2A and 2B illustrate a structure in which the first active layer 130 includes two layers, but another embodiment of the present disclosure is not limited thereto. The first active layer 130 can further include a third oxide semiconductor layer in addition to the first and second oxide semiconductor layers 131 and 132. The third oxide semiconductor layer can be disposed below the first oxide semiconductor layer 131, can be disposed on the second oxide semiconductor layer 132, or can be disposed between the first oxide semiconductor layer 131 and the second oxide semiconductor layer 132.

Figure 3:
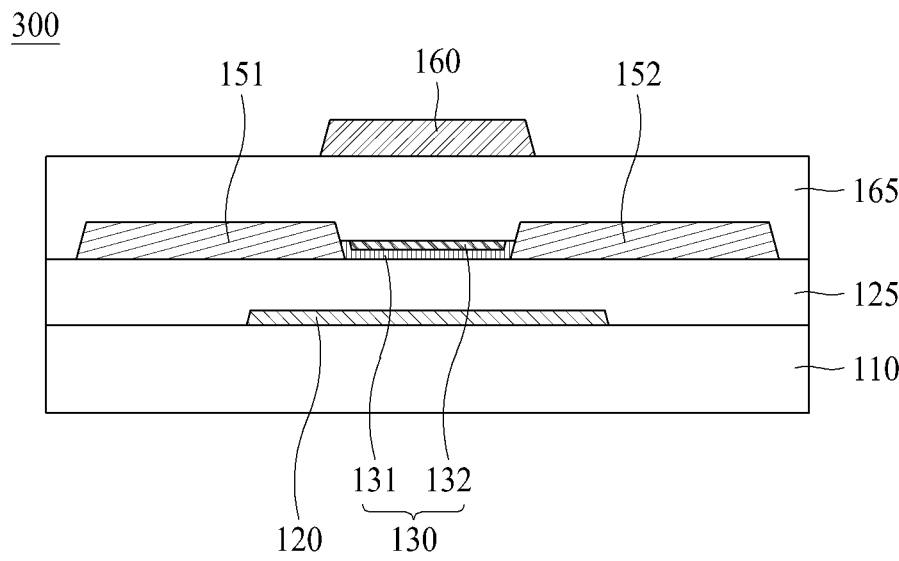
FIG. 3 is a cross-sectional view illustrating another example of a thin film transistor according to an embodiment of the present disclosure.

FIG. 3 is a cross-sectional view illustrating another example of a thin film transistor according to an embodiment of the present disclosure.

As compared with FIGS. 2A and 2B, in a thin film transistor 300 of FIG. 3, the first oxide semiconductor layer 131 can cover sides and a lower surface of the second oxide semiconductor layer 132 as it is disposed under the second oxide semiconductor layer 132. Referring to FIG. 3, the second oxide semiconductor layer 132 may not be in contact with the source electrode 151 and the drain electrode 152.

Since the first oxide semiconductor layer 131 having high mobility characteristics is directly in contact with the side of the source electrode 151 and the side of the drain electrode 152, the thin film transistor 300 can have excellent on-current characteristics.

In the fabricating process of the first active layer 130 that includes the first oxide semiconductor layer 131 and the second oxide semiconductor layer 132, the first oxide semiconductor layer 131 is first formed and then the second oxide semiconductor layer 132 is formed on the first oxide semiconductor layer 131, whereby the first active layer 130 having the structure of FIG. 3 can be formed.

In another variation, the first and second oxide semiconductor layers 131 and 132 can be switched. That is, in FIG. 3, it would be the second oxide semiconductor layer 132 that is disposed under the first oxide semiconductor layer 131 and that surrounds the sides and lower surface of the first oxide semiconductor layer 131. In such case, the first oxide semiconductor layer 131 would not be in contact with the source and drain electrodes 151 and 152, but the second oxide semiconductor layer 132 would be.

Figure 4:
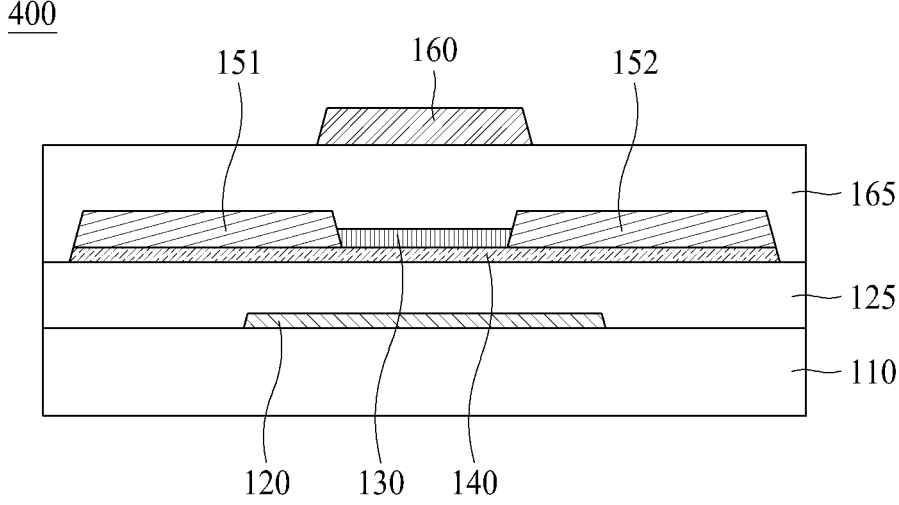
FIG. 4 is a cross-sectional view illustrating another example of a thin film transistor according to an embodiment of the present disclosure.

FIG. 4 is a cross-sectional view illustrating another example of a thin film transistor (thin film transistor 400) according to an embodiment of the present disclosure. The thin film transistor 400 can include a second active layer 140.

Referring to FIG. 4, the second active layer 140 can be disposed below and overlaps the source electrode 151, the drain electrode 152 and the first active layer 130. The second active layer 140 can be disposed between the substrate 110 and the first active layer 130. Therefore, the first active layer 130 can be disposed between the gate electrode 160 and the second active layer 140. The outer ends of the source and drain electrodes 151 and 152 can correspond with or can be aligned with the outer ends of the second active layer 140.

The second active layer 140 can be disposed between the substrate 110 and the source electrode 151 and between the substrate 110 and the drain electrode 152. The second active layer 140 can be in contact with the lower surface of the source electrode 151 and the lower surface of the drain electrode 152.

The second active layer 140 can be integrally formed below the source electrode 151, the drain electrode 152 and the first active layer 130.

According to still another embodiment of the present disclosure, the second active layer 140 can have mobility lower than that of the first active layer 130.

The second active layer 140 can serve to support the first active layer 130.

The second active layer 140 can be made of an oxide semiconductor material having excellent stability and low mobility. For example, the second active layer 140 can be made of a gallium (Ga)-based oxide semiconductor material. In detail, the second active layer 140 can include at least one of an IGZO(InGaZnO)-based oxide semiconductor material [Ga concentration>In concentration], a GZO(GaZnO)-based oxide semiconductor material, an IGO(InGaO)-based oxide semiconductor material or a GZTO(GaZnSnO)-based oxide semiconductor material.

According to still another embodiment of the present disclosure, the second active layer 140 can serve to prevent or suppress a leakage current in an OFF-state of the thin film transistor 400.

When the active layers 130 and 140 are made of an oxide semiconductor material, a positive (+) voltage can be applied to the gate electrode 160 in the ON-state of the thin film transistor 400, and a negative (−) voltage can be applied to the gate electrode 160 in the OFF-state of the thin film transistor 400.

When a negative(−) voltage is applied to the gate electrode 160, even though the thin film transistor 400 is in an OFF-state, electrons that are carriers can be accumulated in a portion of the active layers 130 and 140, which is far away from the gate electrode 160. Due to the accumulated electrons, a leakage current may occur in the OFF-state of the thin film transistor 400.

In the OFF-state of the thin film transistor 400 shown in FIG. 4, a small amount of electrons can be collected in the lower portion of the second active layer 140, which is the lowermost portion of the active layers 130 and 140. In this case, in order to flow a leakage current, electrons should move to a path through which the source electrode 151, the lower portion of the second active layer 140 and the drain electrode 152 pass (see FIG. 9B). However, according to this embodiment of the present disclosure, since the second active layer 140 is disposed below the source electrode 151 and the drain electrode 152, the path of electrons which may cause a leakage current can be lengthened, so that the leakage current can be suppressed. In addition, since the second active layer 140 has semiconductor characteristics but has low mobility, the leakage current through the second active layer 140 can be almost disregarded.

Therefore, according to this embodiment of the present disclosure, the leakage current of the thin film transistor 400 can be avoided or suppressed by the second active layer 140.

Figure 5:
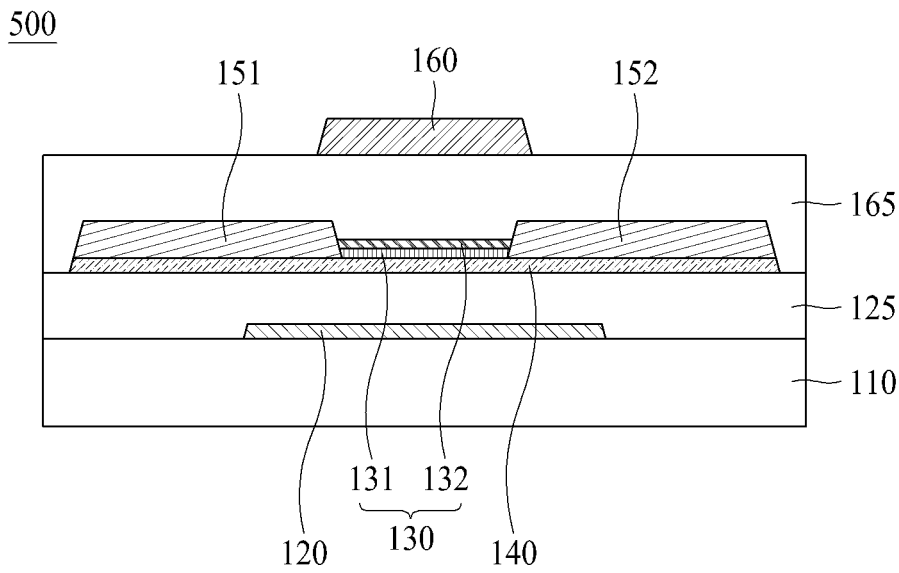
FIG. 5 is a cross-sectional view illustrating another example of a thin film transistor according to an embodiment of the present disclosure.

FIG. 5 is a cross-sectional view illustrating another example of a thin film transistor (thin film transistor 500) according to an embodiment of the present disclosure.

Referring to FIG. 5, the first active layer 130 of the thin film transistor 500 can include a first oxide semiconductor layer 131 and a second oxide semiconductor layer 132. The second oxide semiconductor layer 132 can be disposed on the first oxide semiconductor layer 131.

The first oxide semiconductor layer 131 can be in contact with the second active layer 140. The second active layer 140 is disposed below the source electrode 151, the first active layer 130 and the drain electrode 152, and is disposed on the buffer layer 125. For instance, the thin film transistor 500 can be the same as the thin film transistor 400, but the first and second oxide semiconductor layers 131 and 132 are disposed in the space between the source and drain electrodes 151 and 152.

The first oxide semiconductor layer 131 can have mobility higher than that of the second oxide semiconductor layer 132. The first oxide semiconductor layer 131 can serve as a main channel layer. The first oxide semiconductor layer 131 can be made of, for example, a high mobility oxide semiconductor material.

The second oxide semiconductor layer 132 can be made of an oxide semiconductor material having excellent stability. For example, the second active layer 140 can be formed of a gallium (Ga)-based oxide semiconductor material. The second oxide semiconductor layer 132 can be made of the same semiconductor material as that of the second active layer 140, or can be made of another semiconductor material different from that of the second active layer 140.

In addition, the first oxide semiconductor layer 131 can have mobility higher than that of the second active layer 140.

The second active layer 140 can be made of an oxide semiconductor material having excellent stability and low mobility. For example, the second active layer 140 can be made of a gallium (Ga)-based oxide semiconductor material. According to one embodiment of the present disclosure, the second oxide semiconductor layer 132 can have excellent stability to protect the first oxide semiconductor layer 131. The second active layer 140 can have low mobility to prevent a leakage current from occurring. For example, the second active layer 140 can have mobility lower than that of the second oxide semiconductor layer 132. When the second active layer 140 and the second oxide semiconductor layer 132 have the same metal composition, a high oxygen partial pressure can be applied to the second active layer 140 during the fabricating process of the second active layer 140 so that the second active layer 140 has low mobility.

However, this embodiment of the present disclosure is not limited to the above example, and the second oxide semiconductor layer 132 can have mobility lower than that of the second active layer 140. Even though the second oxide semiconductor layer 132 has low mobility, when the second oxide semiconductor layer 132 is thin, driving characteristics of the thin film transistor 500 may not be deteriorated.

According to further still another embodiment of the present disclosure, the first oxide semiconductor layer 131 can have a thickness of 3 nm to 20 nm, preferably a thickness of 5 nm to 10 nm. The second oxide semiconductor layer 132 can have a thickness of 2 nm to 5 nm, preferably a thickness of 2 nm to 4 nm. The second active layer 140 can have a thickness of 5 nm to 30 nm, preferably a thickness of 10n to 20 nm.

Referring to FIG. 5, the first oxide semiconductor layer 131 can be protected by the second oxide semiconductor layer 132 and the second active layer 140, which have excellent stability. Since the first oxide semiconductor layer 131 is protected between the second oxide semiconductor layer 132 and the second active layer 140, the thin film transistor 500 can have excellent driving stability, and its reliability can be improved.

Figure 6:
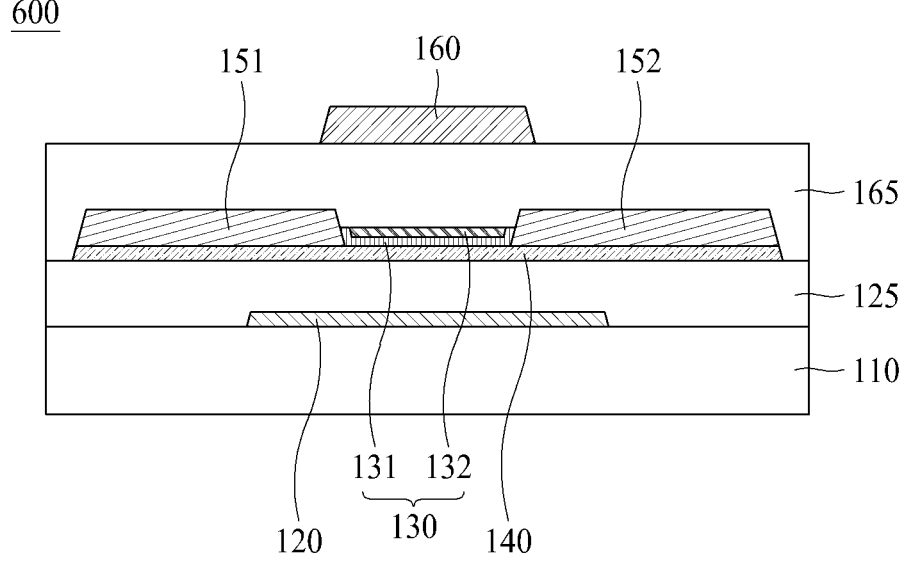
FIG. 6 is a cross-sectional view illustrating another example of a thin film transistor according to an embodiment of the present disclosure.

FIG. 6 is a cross-sectional view illustrating another example of a thin film transistor (thin film transistor 600) according to an embodiment of the present disclosure.

Referring to FIG. 6, the first oxide semiconductor layer 131 can cover sides and a lower surface of the second oxide semiconductor layer 132.

Referring to FIG. 6, the second oxide semiconductor layer 132 may not be in contact with the source electrode 151 and the drain electrode 152, and may not be in contact with the second active layer 140, either.

As the first oxide semiconductor layer 131 having high mobility characteristics is directly contact with the side of the source electrode 151 and the side of the drain electrode 152, the thin film transistor 600 can have excellent on-current characteristics.

Here, the thin film transistor 600 can have the same or similar configuration as the thin film transistor 500, but the first and second oxide semiconductor layers 131 and 132 are configured as shown in FIG. 3.

Figure 10A:
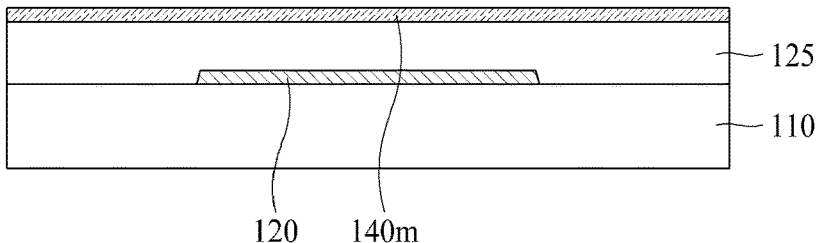
Figure 10B:
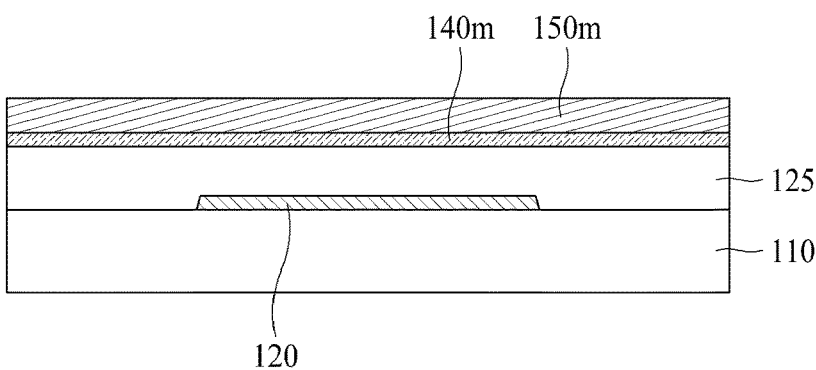
Figure 10C:
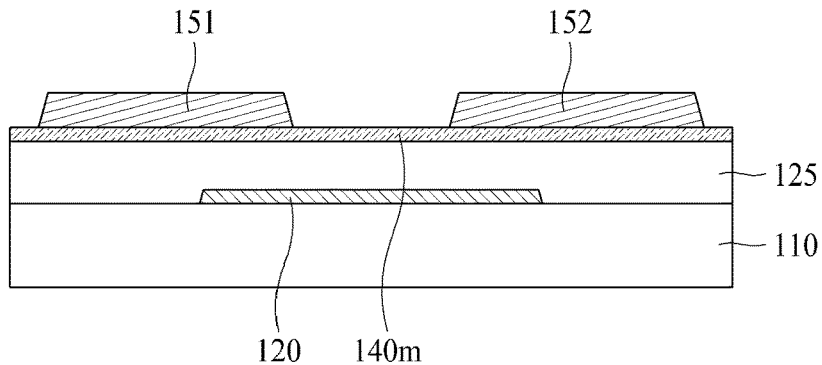
Figure 10D:
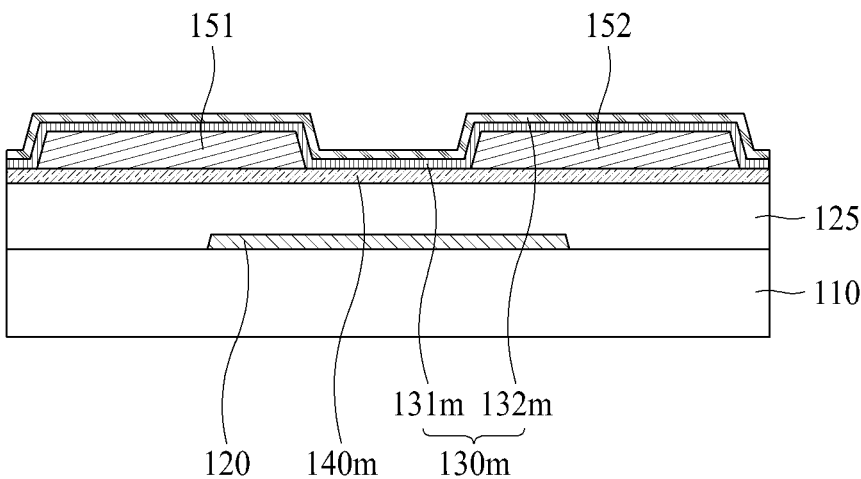
Figure 10E:
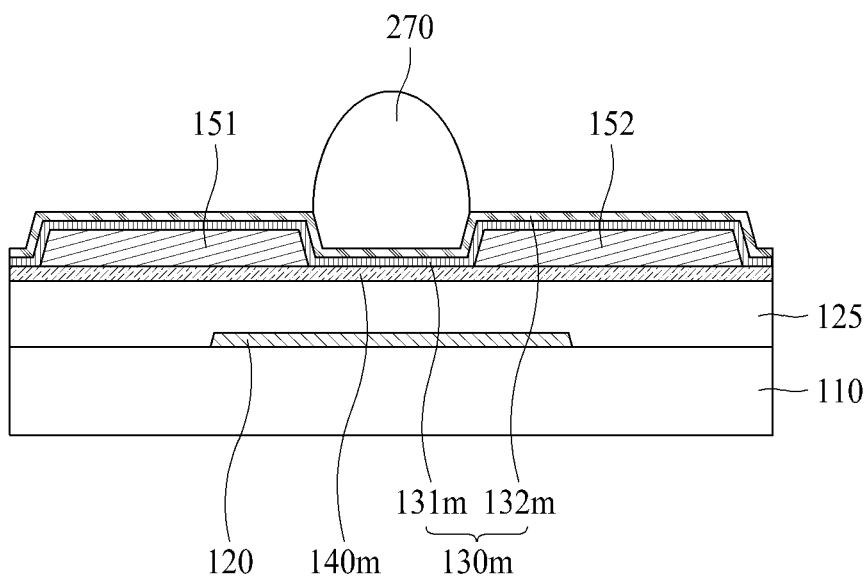
Figure 10F:
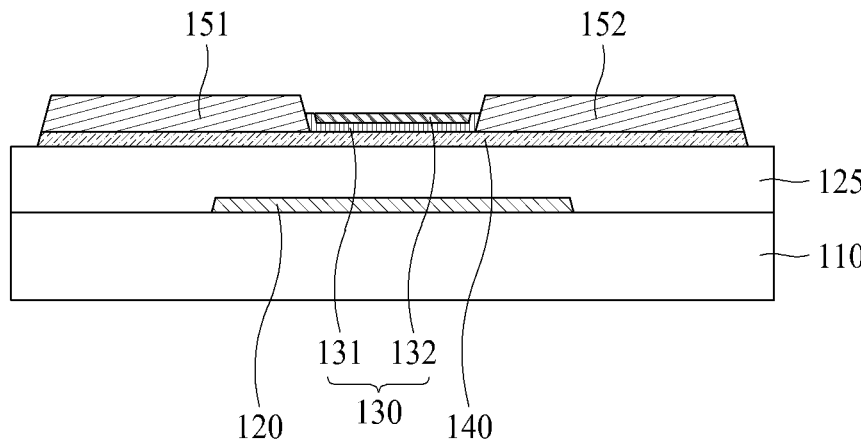

In the process of forming the first active layer 130 that includes the first oxide semiconductor layer 131 and the second oxide semiconductor layer 132, when the first oxide semiconductor layer 131 is first formed and then the second oxide semiconductor layer 132 is formed on the first oxide semiconductor layer 131, the first active layer 130 having the structure of FIG. 6 can be formed (see FIGS. 10E and 10F).

FIGS. 7A and 7B are schematic views illustrating an ON-current path of thin film transistors 71 and 72 according to a comparative example.

Particularly, FIGS. 7A and 7B, respectively, show thin film transistors 71 and 72 that have three oxide semiconductor layers, but do not include a second active layer such as the second active layer 140 of the present disclosure.

The thin film transistors 71 and 72 of FIGS. 7A and 7B include an active layer 130 comprised of oxide semiconductor layers 131, 132 and 133. In the thin film transistor 71 of FIG. 7A, the oxide semiconductor layers 131, 132 and 133 are disposed below the source electrode 151 and the drain electrode 152. In the thin film transistor 72 of FIG. 7B, the oxide semiconductor layers 131, 132 and 133 are disposed on the source electrode 151 and the drain electrode 152.

The oxide semiconductor layers 131, 132 and 133 can have n-type semiconductor characteristics, and thus a positive (+) voltage is applied to the gate electrode 160 to turn on the thin film transistor having the active layer comprised of the oxide semiconductor layers 131, 132 and 133.

When the positive (+) voltage is applied to the gate electrode 160, current can mainly flow through a path of the oxide semiconductor layers 131, 132 and 133, which has high mobility or is close to the gate electrode 160. As a result, the current primarily flows through the path indicated by arrows in FIGS. 7A and 7B.

In the thin film transistors 71 and 72 of FIGS. 7A and 7B, the current flows through a path over the lower or upper portion of the source electrode 151 and the drain electrode 152. In this case, since the current path is lengthened and thus resistance may be increased, on-current characteristics of the thin film transistor may be deteriorated.

FIG. 8 is a schematic view illustrating an ON-current path of the thin film transistor 600 according to an example of the present disclosure.

Referring to FIG. 8, in the thin film transistor 600 according to another embodiment of the present disclosure, the first active layer 130 is disposed only in the space between the source electrode 151 and the drain electrode 152 without being in contact with the upper surface 151a and the lower surface 151b of the source electrode 151. The first active layer 130 can be in contact with the side of the source electrode 151 and the side of the drain electrode 152, thereby making sure of the shortest charge transfer path between the source electrode 151 and the drain electrode 152. Therefore, current can flow between the source electrode 151 and the drain electrode 152 through the shortest path without loss on the path. As a result, on-current characteristics of the thin film transistor 600 can be improved.

FIGS. 9A and 9B are schematic views illustrating a leakage current path of a thin film transistor.

Particularly, FIG. 9A shows a thin film transistor that includes three oxide semiconductor layers 131, 132 and 133, but does not include a second active layer such as the second active layer 140 of the present disclosure. FIG. 9B shows a portion of the thin film transistor 500 according to an embodiment of the present disclosure, which includes the second active layer 140.

When the active layers are made of an oxide semiconductor material, a negative (−) voltage can be applied to the gate electrode 160 in the OFF-state of the thin film transistor.

When the negative (−) voltage is applied to the gate electrode 160, even though the thin film transistor is in the OFF-state, electrons that are carriers can be accumulated in a place of the oxide semiconductor layers 131, 132, 133, which is far away from the gate electrode 160. Due to the accumulated electrons, a leakage current can occur.

Referring to FIG. 9A, in the OFF-state of the thin film transistor, the electrons can be accumulated in the oxide semiconductor layer 133 positioned at the lowermost portion. When the electrons move between the source electrode 151 and the drain electrode 152, a leakage current can occur.

Referring to FIG. 9B, the thin film transistor 500 according to one embodiment of the present disclosure includes the second active layer 140 disposed below the first active layer 130. In the OFF-state of the thin film transistor shown in FIG. 9B, electrons that are carriers can be collected below the second active layer 140, which is positioned at the lowermost portion, of the active layers 130 and 140. Since the second active layer 140 is disposed below the source electrode 151 and the drain electrode 152, the path of electrons which may cause a leakage current can be lengthened, so that the leakage current can be suppressed in the thin film transistor 500 of FIG. 9B. Also, since the second active layer 140 has semiconductor characteristics but has low mobility, the leakage current through the second active layer 140 can be almost disregarded or minimized.

Therefore, according to one or more embodiments of the present disclosure, the leakage current of the thin film transistor of FIG. 9A can be avoided or suppressed by the second active layer 140.

Hereinafter, a fabricating method of the thin film transistor 600 according to one embodiment of the present disclosure will be described with reference to FIGS. 10A to 10G.

FIGS. 10A to 10G are views illustrating a fabricating process of the thin film transistor 600 according to an embodiment of the present disclosure.

Referring to FIG. 10A, a light shielding layer 120 can be formed on a substrate 110, and a buffer layer 125 can be formed on the light shielding layer 120. A second active material layer 140m for forming a second active layer 140 can be formed on the buffer layer 125. The second active material layer 140m can be made of a low mobility oxide semiconductor material having excellent stability, for example.

Referring to FIG. 10B, a conductive material layer 150m for forming a source electrode 151 and a drain electrode 152 can be formed on the second active material layer 140m. The conductive material layer 150m can include at least one of molybdenum (Mo), aluminum (Al), chromium (Cr), gold (Au), titanium (Ti), nickel (Ni), neodymium (Nd), copper (Cu) or their alloy. The conductive material layer 150m can include, for example, titanium (Ti) having excellent etch stability.

For example, the source electrode 151 and the drain electrode 152 can have a single layered structure comprised of titanium (Ti). The source electrode 151 and the drain electrode 152 can have a multi-layered structure that includes a layer made of titanium (Ti). In the case that the source electrode 151 and the drain electrode 152 have a multi-layered structure that includes a layer made of titanium (Ti), the layer made of titanium (Ti) can be disposed on the uppermost layer of the source electrode 151 and the drain electrode 152.

Referring to FIG. 10C, the conductive material layer 150m can be patterned to form the source electrode 151 and the drain electrode 152. The source electrode 151 and the drain electrode 152 are formed on the second active material layer 140m.

Referring to FIG. 10D, a first active material layer 130m for forming a first active layer 130 can be formed on the second active material layer 140m, the source electrode 151 and the drain electrode 152. In detail, the first active material layer 130m can be disposed between the source electrode 151 and the drain electrode 152 and on the source electrode 151 and the drain electrode 152.

Referring to FIG. 10D, the first active material layer 130m can include a first oxide semiconductor material layer 131m and a second oxide semiconductor material layer 132m. Therefore, the step of forming the first active material layer 130m can include forming the first oxide semiconductor material layer 131m and forming the second oxide semiconductor material layer 132m.

Referring to FIG. 10E, a photoresist pattern 270 can be formed to pattern the first active material layer 130m and the second active material layer 140m. The photoresist pattern 270 can be disposed on an upper portion of the second oxide semiconductor material layer 132 between the source electrode 151 and the drain electrode 152.

Referring to FIG. 10F, the first active material layer 130m and the second active material layer 140m can be patterned to form the first active layer 130 and the second active layer 140.

A photolithography method using the photoresist pattern 270 can be applied in order to form the first active layer 130 and the second active layer 140.

Referring to FIGS. 10E and 10F, the first active material layer 130m and the second active material layer 140m can be patterned together by the photolithography method using the photoresist pattern 270. As a result, the first active layer 130 and the second active layer 140 can be formed simultaneously.

Referring to FIG. 10F, the first active layer 130 can be disposed between the source electrode 151 and the drain electrode 152 to contact the second active layer 140.

Figure 10G:
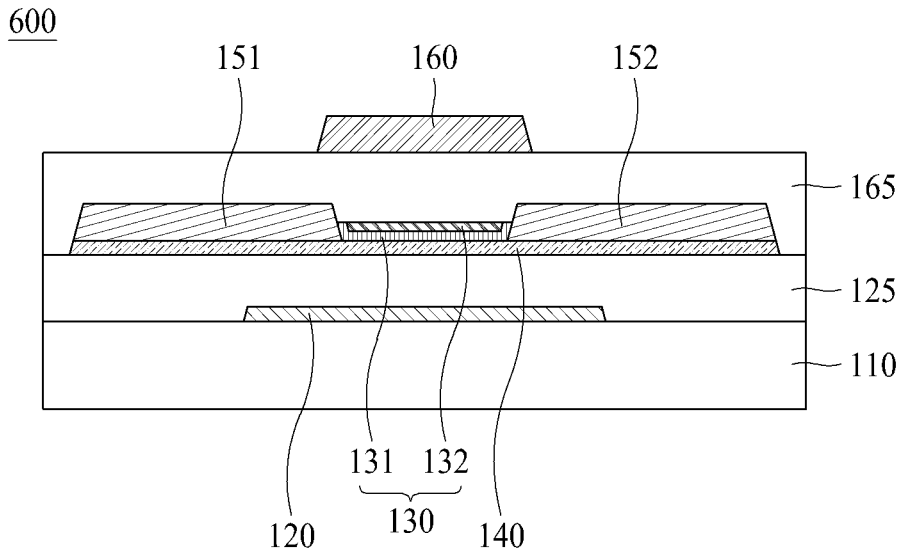

Referring to FIG. 10G, a gate insulating layer 165 can be formed on the first active layer 130, the source electrode 151 and the drain electrode 152, and a gate electrode 160 can be formed on the gate insulating layer 165. As a result, the thin film transistor 600 according to further still another embodiment of the present disclosure can be made.

Additional layers may be formed over each thin film transistor of the present disclosure.

FIG. 11 is a schematic view illustrating an example of a display device (display device 700) according to an embodiment of the present disclosure.

As shown in FIG. 11, the display device 700 according to an embodiment of the present disclosure includes a display panel 310, a gate driver 320, a data driver 330 and a controller 340.

Gate lines GL and data lines DL are disposed in the display panel 310, and pixels P are disposed in intersection areas of the gate lines GL and the data lines DL. An image is displayed by driving of the pixels P.

The controller 340 controls the gate driver 320 and the data driver 330. The controller 340 outputs a gate control signal GCS for controlling the gate driver 320 and a data control signal DCS for controlling the data driver 330 by using a signal that is supplied from an external system. Also, the controller 340 samples input image data input from the external system, realigns the sampled data and supplies the realigned digital image data RGB to the data driver 330.

The gate control signal GCS can include one or more of a gate start pulse GSP, a gate shift clock GSC, a gate output enable signal GOE, a start signal Vst and a gate clock GCLK. Also, control signals for controlling a shift register can be included in the gate control signal GCS.

The data control signal DCS can include one or more of a source start pulse SSP, a source shift clock signal SSC, a source output enable signal SOE, and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL.

The gate driver 320 can include a shift register 350. The shift register 350 sequentially supplies gate pulses to the gate lines GL for one frame by using the start signal and the gate clock, which are transmitted from the controller 340. In this case, one frame preferably can mean a time period when one image is output through the display panel 310. The gate pulse has a turn-on voltage that can turn on a switching element (thin film transistor) disposed in the pixel P.

Also, the shift register 350 supplies a gate-off signal capable of turning off a switching element, to the gate line GL for the other period of one frame, at which the gate pulse is not supplied. Hereinafter, the gate pulse and the gate-off signal will collectively be referred to as a scan signal SS or Scan.

According to one embodiment of the present disclosure, the gate driver 320 can be packaged on the display panel 310. In this way, a structure in which the gate driver 320 can be directly packaged on the display panel 310 will be referred to as a Gate In Panel (GIP) structure.

FIG. 12 is a circuit diagram illustrating an example of a pixel P of FIG. 11, FIG. 13 is a plan view illustrating a pixel P of FIG. 12, and FIG. 14 is a cross-sectional view taken along line I-I' of FIG. 13.

For instance, each pixel P of FIG. 11 can have the configuration of the pixel of FIGS. 12 and/or 13.

The circuit diagram of FIG. 12 can be an equivalent circuit diagram for the pixel P of the display device 700 that includes an organic light emitting diode (OLED) as a display element 710.

Each pixel P includes a display element 710 and a pixel driving circuit PDC for driving the corresponding display element 710. The pixel driving circuit PDC of FIG. 12 includes a first thin film transistor TR1 that is a switching transistor, and a second thin film transistor TR2 that is a driving transistor.

The display device 700 according to an embodiment of the present disclosure can include at least one of the thin film transistors 100, 201, 202, 300, 400, 500 and 600 shown in FIGS. 1 to 6. For instance, each thin film transistor (e.g., one or more of the first and second thin film transistors TR1 and TR2) and any other thin film transistor (if present) of each pixel P can have the configuration of one of the thin film transistors 100, 201, 202, 300, 400, 500 and 600.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls the driving voltage Vdd. The driving voltage Vdd is a pixel driving voltage for driving the organic light emitting diode (OLED) that is the display element 710.

When the first thin film transistor TR1 is turned on by the scan signal SS applied from the gate driver 320 through the gate line GL, the data voltage Vdata supplied through the data line DL is supplied to a gate electrode G2 of the second thin film transistor TR2 connected with the display element 710. The data voltage Vdata is charged in a first capacitor C1 formed between the gate electrode G2 and a source electrode S2 of the second thin film transistor TR2. The first capacitor C1 is a storage capacitor Cst.

The amount of current supplied to the organic light emitting diode (OLED), which is the display element 710, through the second thin film transistor TR2 is controlled in accordance with the data voltage Vdata, whereby a gray scale of light emitted from the display element 710 can be controlled.

Referring to FIGS. 13 and 14, the first thin film transistor TR1 and the second thin film transistor TR2 are disposed on the substrate 110.

The substrate 110 can be made of glass or plastic. Plastic having a flexible property, for example, polyimide (PI) can be used as the substrate 110.

A light shielding layer 120 is disposed on the substrate 110. The light shielding layer 120 can shield light incident from the outside to protect active layers A1 and A2. In examples, the active layers A1 and A2 can correspond respectively to the first and second active layers of FIGS. 1-6.

A buffer layer 125 is disposed on the light shielding layer 120. The buffer layer 125 is made of an insulating material and protects the active layers A1 and A2 from external water or oxygen.

The active layer A1 of the first thin film transistor TR1 and the active layer A2 of the second thin film transistor TR2 are disposed on the buffer layer 125.

Each of the active layers A1 and A2 can include an oxide semiconductor material. According to another embodiment of the present disclosure, the active layers A1 and A2 are oxide semiconductor layers made of an oxide semiconductor material. For example, each of the active layers A1 and A2 can include a first active layer 130 and a second active layer 140.

In detail, the second active layer 140 can be disposed on the buffer layer 125.

Source electrodes S1 and S2 and drain electrodes D1 and D2 can be disposed on the second active layer 140. The source electrode S1 and the drain electrode D1 of the first thin film transistor TR1 can be disposed on the second active layer 140 of the first thin film transistor TR1. The source electrode S2 and the drain electrode D2 of the second thin film transistor TR2 can be disposed on the second active layer 140 of the second thin film transistor TR2.

According to still another embodiment of the present disclosure, the source electrodes S1 and S2 and the drain electrodes D1 and D2 are only distinguished for convenience of description, and the source electrodes S1 and S2 and the drain electrodes D1 and D2 can be used interchangeably. Therefore, the source electrodes S1 and S2 can be the drain electrodes D1 and D2, and the drain electrodes D1 and D2 can be the source electrodes S1 and S2.

A data line DL and a driving power line PL can be disposed on the buffer layer 125.

Referring to FIGS. 13 and 14, the data line DL can be formed by the second active layer 140 and the source electrode S1 of the first thin film transistor TR1. The source electrode S1 of the first thin film transistor TR1 can be integrally formed with the data line DL.

Also, the driving power line PL can be formed by the second active layer 140 and the drain electrode D2 of the second thin film transistor TR2. Referring to FIGS. 13 and 14, the drain electrode D2 of the second thin film transistor TR2 can be integrally formed with the driving power line PL.

According to still another embodiment of the present disclosure, the source electrode S1 of the first thin film transistor TR1 can be connected with the data line DL without a contact hole. Also, the active layer A1 of the first thin film transistor TR1 can be connected with the source electrode S1 and the drain electrode D1, respectively, without a contact hole.

According to still another embodiment of the present disclosure, the drain electrode D2 of the second thin film transistor TR2 can be connected with the driving power line PL without a contact hole. Also, the active layer A2 of the second thin film transistor TR2 can be connected with the source electrode S2 and the drain electrode D2, respectively, without a contact hole.

The source electrode S2 of the second thin film transistor TR2 is extended over the buffer layer 125, and thus a portion thereof can serve as a first capacitor electrode CE1 of the first capacitor C1. The first capacitor electrode CE1 can be provided in a structure in which a portion of the source electrode S2 of the second thin film transistor TR2 is overlapped with a portion of the second active layer 140.

A gate insulating layer 165 is disposed on the active layers A1 and A2, the source electrodes S1 and S2, the drain electrodes D1 and D2 and the first capacitor electrode CE1. The gate insulating layer 165 has insulation property, and spaces the active layers A1 and A2 apart from the gate electrodes G1 and G2.

The gate electrode G1 of the first thin film transistor TR1 and the gate electrode G2 of the second thin film transistor TR2 are disposed on the gate insulating layer 165.

The gate electrode G1 of the first thin film transistor TR1 overlaps the active layer A1 of the first thin film transistor TR1. The gate electrode G2 of the second thin film transistor TR2 overlaps the active layer A2 of the second thin film transistor TR2.

Referring to FIGS. 13 and 14, the second capacitor electrode CE2 of the first capacitor C1 is disposed on the same layer as the gate electrodes G1 and G2. The gate electrodes G1 and G2 and the second capacitor electrode CE2 can be made by the same process using the same material.

The second capacitor electrode CE2 can be extended to the drain electrode D1 of the first thin film transistor TR1 through a first contact hole H1 formed in the gate insulating layer 165 and extended to the source electrode S2 of the second thin film transistor TR2 through a second contact hole H2 formed in the gate insulating layer 165. A portion of the second capacitor electrode CE2 can be extended to the upper portion of the active layer A2 of the second thin film transistor TR2, and thus can become the gate electrode G2 of the second thin film transistor TR2.

As a result, the first thin film transistor TR1 and the second thin film transistor TR2 can be formed.

Also, a first bridge BR1 can be formed on the gate insulating layer 165. The first bridge BR1 is connected to the source electrode S2 of the second thin film transistor TR2.

A planarization layer 175 is disposed on the gate electrodes G1 and G2, the second capacitor electrode CE2 and the first bridge BR1. The planarization layer 175 planarizes upper portions of the first thin film transistor TR1 and the second thin film transistor TR2, and protects the first thin film transistor TR1 and the second thin film transistor TR2.

A first electrode 711 of the display element 710 is disposed on the planarization layer 175. The first electrode 711 of the display element 710 can be connected with the first bridge BR1 through a third contact hole H3 formed in the planarization layer 175. As a result, the first electrode 711 of the display element 710 can be electrically connected with the source electrode S2 of the second thin film transistor TR2.

A bank layer 750 is disposed at an edge of the first electrode 711. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 14 is an organic light emitting diode (OLED) in this example. Therefore, the display device 700 according to an embodiment of the present disclosure is an organic light emitting display device.

FIG. 15 is a circuit diagram illustrating another example of a pixel P of a display device (display device 800) according to an embodiment of the present disclosure. Particularly, FIG. 15 is an equivalent circuit diagram illustrating a pixel P of an organic light emitting display device in this example. For example, the display device 800 can have the same or similar configuration as the display device 700, but each pixel P has the configuration shown in FIG. 15.

Each pixel P of the display device 800 shown in FIG. 15 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

The pixel driving circuit PDC includes, for example, a first thin film transistor TR1 (switching transistor) connected with the gate line GL and the data line DL, a second thin film transistor TR2 (driving transistor) for controlling a magnitude of current output to the display element 710 in accordance with the data voltage Vdata transmitted through the first thin film transistor TR1, and a third thin film transistor TR3 (sensing transistor) for sensing characteristics of the second thin film transistor TR2.

A first capacitor C1 is disposed between the gate electrode of the second thin film transistor TR2 and the display element 710. The first capacitor C1 can be referred to as a storage capacitor Cst.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to a first node n1 between the second thin film transistor TR2 and the display element 710 and the reference line RL, and thus is turned on or off by the sensing control signal SCS and senses characteristics of the second thin film transistor TR2, which is a driving transistor, for a sensing period.

A second node n2 connected with the gate electrode of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode of the second thin film transistor TR2. The data voltage Vdata is charged in the first capacitor C1 formed between the gate electrode and the source electrode S2 of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

The display device 800 according to an embodiment of the present disclosure can include at least one of the thin film transistors 100, 201, 202, 300, 400, 500 and 600 shown in FIGS. 1 to 6. For instance, each thin film transistor (e.g., one or more of the first, second and third thin film transistors TR1-TR3) and any other thin film transistor (if present) of each pixel P can have the configuration of one of the thin film transistors 100, 201, 202, 300, 400, 500 and 600.

FIG. 16 is a circuit diagram illustrating another example of a pixel of a display device (display device 900) according to an embodiment of the present disclosure.

Referring to FIG. 16, each pixel P of the display device 900 shown in FIG. 16 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 15, the pixel P of FIG. 16 further includes an emission control line EL. An emission control signal EM is supplied to the emission control line EL.

Also, the pixel driving circuit PDC of FIG. 16 further includes a fourth thin film transistor TR4 that is an emission control transistor for controlling a light emission timing of the second thin film transistor TR2, in comparison with the pixel driving circuit PDC of FIG. 15.

A first capacitor C1 is positioned between the gate electrode G2 of the second thin film transistor TR2 and the display element 710.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to the reference line RL, and thus is turned on or off by the sensing control signal SCS and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM or shields the driving voltage Vdd. When the fourth thin film transistor is turned on, current is supplied to the second thin film transistor TR2, whereby light is output from the display element 710.

The display device 900 according to an embodiment of the present disclosure can include at least one of the thin film transistors 100, 201, 202, 300, 400, 500 and 600 shown in FIGS. 1 to 6. For instance, each thin film transistor (e.g., one or more of the first to fourth thin film transistors TR1-TR4) and any other thin film transistor (if present) of each pixel P can have the configuration of one of the thin film transistors 100, 201, 202, 300, 400, 500 and 600.

The pixel driving circuit PDC according to an embodiment of the present disclosure can be formed in various structures in addition to the above-described structure. The pixel driving circuit PDC can include, for example, five or more thin film transistors.

FIG. 17 is a circuit diagram illustrating another example of a pixel P of a display device (display device 1000) according to an embodiment of the present disclosure. In this example, the display device 1000 of FIG. 17 is a liquid crystal display device. As such, in addition to the pixel configuration shown in FIG. 17, the display device 1000 further include known elements/configurations such as a liquid crystal display panel including such pixels P, a gate driver, a data driver, a timing controller, etc.

Each pixel P of the display device 1000 shown in FIG. 17 includes a pixel driving circuit PDC and a liquid crystal capacitor C1c connected with the pixel driving circuit PDC. The liquid crystal capacitor C1c corresponds to the display element.

The pixel driving circuit PDC includes a thin film transistor TR connected with the gate line GL and the data line DL, and a storage capacitor Cst connected between the thin film transistor TR and a common electrode 372. The liquid crystal capacitor C1c is connected with the storage capacitor Cst in parallel between the thin film transistor TR and the common electrode 372.

The liquid crystal capacitor C1c charges a differential voltage between a data signal supplied to a pixel electrode 371 through the thin film transistor TR and a common voltage Vcom supplied to the common electrode 372, and controls a light-transmissive amount by driving liquid crystals in accordance with the charged voltage. The storage capacitor Cst stably maintains the voltage charged in the liquid crystal capacitor C1c.

The display device 1000 according to an embodiment of the present disclosure can include at least one of the thin film transistors 100, 201, 202, 300, 400, 500 and 600 shown in FIGS. 1 to 6. For instance, each thin film transistor (e.g., the thin film transistor TR) and any other thin film transistor (if present) of each pixel P can have the configuration of one of the thin film transistors 100, 201, 202, 300, 400, 500 and 600.

According to one or more embodiments of the present disclosure, the following advantageous effects can be obtained.

According to one embodiment of the present disclosure, as the active layer is disposed between the source electrode and the drain electrode, on-current characteristics of the thin film transistor can be improved, and an alignment error can be avoided during the fabricating process of the thin film transistor. In addition, since the active layer can be electrically connected to the source electrode and the drain electrode without a separate contact hole, the number of contact holes can be reduced.

According to one or more embodiments of the present disclosure, the second active layer is provided, which is in contact with the first active layer disposed below the source electrode and the drain electrode to serve as a main channel, whereby the leakage current of the thin film transistor can be effectively avoided.

According to one or more embodiments of the present disclosure, an additional active layer can be further disposed on and below the main active layer serving as a main channel, whereby the main active layer can be effectively protected.

The display device according to one or more embodiments of the present disclosure, which uses the thin film transistor, can have stable and excellent display quality.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A thin film transistor comprising:
a source electrode and a drain electrode disposed on a substrate, and spaced apart from each other with a gap area formed therebetween;
a first active layer disposed in the gap area between the source electrode and the drain electrode;
a gate insulating layer covering the first active layer; and
a gate electrode disposed on the gate insulating layer, and overlapping the first active layer,
wherein the first active layer is in contact with a side of the source electrode and a side of the drain electrode,
wherein the gate electrode covers the entire first active layer disposed in the gap area,
wherein the first active layer includes a first oxide semiconductor layer and a second oxide semiconductor layer, both disposed in the gap area between the source and drain electrodes, and
wherein the first oxide semiconductor layer has mobility higher than mobility of the second oxide semiconductor layer.

2. The thin film transistor of claim 1, wherein the first active layer is not in contact with an upper surface and a lower surface of the source electrode, and is not in contact with an upper surface and a lower surface of the drain electrode.

3. The thin film transistor of claim 1, wherein the first active layer has a thickness equal to or smaller than a thickness of the source electrode and/or a thickness of the drain electrode.

4. The thin film transistor of claim 1, wherein each of the source electrode and the drain electrode has an etch rate smaller than an etch rate of the first active layer.

5. The thin film transistor of claim 1, wherein each of the source electrode and the drain electrode includes titanium (Ti).

6. The thin film transistor of claim 1, wherein the first oxide semiconductor layer is disposed below the second oxide semiconductor layer in the gap area, and surrounds sides and a lower surface of the second oxide semiconductor layer in the gap area.

7. The thin film transistor of claim 1, wherein the second oxide semiconductor layer is disposed on the first oxide semiconductor layer in the gap area, and is not in contact with the source electrode and the drain electrode.

8. The thin film transistor of claim 1, wherein the entire first and second oxide semiconductor layers are contained inside the gap area between the source and drain electrodes.

9. A display device comprising:
a display panel configured to display images, and including a plurality of pixels arranged on a substrate,
wherein each of the plurality of pixels includes at least one thin film transistor, and
wherein each of the at least one thin film transistor has a configuration of the thin film transistor of claim 1.

10. The thin film transistor of claim 1, further comprising a second active layer disposed below the source electrode, the drain electrode and the first active layer,
wherein the first active layer is disposed between the gate electrode and the second active layer.

11. The thin film transistor of claim 10, wherein the second active layer is in contact with a lower surface of the source electrode, a lower surface of the drain electrode, and a lower surface of the first active layer.

12. The thin film transistor of claim 10, wherein the second active layer has mobility lower than mobility of the first active layer.

13. The thin film transistor of claim 10, wherein the first oxide semiconductor layer is in contact with the second active layer.

14. The thin film transistor of claim 13, wherein the second active layer has the mobility lower than the mobility of the second oxide semiconductor layer.

15. The thin film transistor of claim 13, wherein the first oxide semiconductor layer is disposed below the second oxide semiconductor layer in the gap area, and surrounds sides and a lower surface of the second oxide semiconductor layer in the gap.

16. The thin film transistor of claim 13, wherein the second oxide semiconductor layer is disposed on the first oxide semiconductor layer in the gap area, and is not in contact with the source electrode, the drain electrode and the second active layer.

17. A thin film transistor comprising:
a source electrode and a drain electrode disposed on a substrate, and spaced apart from each other with a gap area formed therebetween;
a first active layer disposed in the gap area between the source electrode and the drain electrode;
a gate insulating layer covering the first active layer; and
a gate electrode disposed on the gate insulating layer, and overlapping the first active layer,
wherein the first active layer is in contact with a side of the source electrode and a side of the drain electrode,
wherein the first active layer includes a first oxide semiconductor layer and a second oxide semiconductor layer, both disposed in the gap area between the source and drain electrodes,
wherein the second oxide semiconductor layer is disposed on the first oxide semiconductor layer in the gap area, and is not in contact with the source electrode and the drain electrode, and
wherein the first oxide semiconductor layer has mobility higher than mobility of the second oxide semiconductor layer.

18. A thin film transistor comprising:
a source electrode and a drain electrode disposed on a substrate, and spaced apart from each other with a gap area formed therebetween;
a first active layer disposed in the gap area between the source electrode and the drain electrode;
a gate insulating layer covering the first active layer;
a gate electrode disposed on the gate insulating layer, and overlapping the first active layer; and a second active layer disposed below the source electrode, the drain electrode and the first active layer, wherein the first active layer is in contact with a side of the source electrode and a side of the drain electrode, wherein the first active layer is disposed between the gate electrode and the second active layer, wherein the first active layer includes a first oxide semiconductor layer and a second oxide semiconductor layer, both disposed in the gap area between the source and drain electrodes, and wherein the first oxide semiconductor layer has mobility higher than mobility of the second oxide semiconductor layer.

19. A fabricating method of a thin film transistor, the fabricating method comprising:

forming a second active material layer on a substrate;

forming a source electrode and a drain electrode on the second active material layer;

forming a first active material layer on the second active material layer, the source electrode and the drain electrode; and patterning the first active material layer and the second active material layer to form a first active layer and a second active layer, wherein the first active layer is disposed in a gap area between the source electrode and the drain electrode, and is in contact with the second active layer, wherein the forming of the first active material layer includes forming a first oxide semiconductor material layer and a second oxide semiconductor material layer, on the second active material layer, the source electrode and the drain electrode, wherein the first active layer includes a first oxide semiconductor layer and a second oxide semiconductor layer, both disposed in the gap area between the source and drain electrodes, and wherein the first oxide semiconductor layer has mobility higher than mobility of the second oxide semiconductor layer.

20. The fabricating method of claim 19, wherein the first active material layer and the second active material layer are patterned together.

\* \* \* \* \*